(12) United States Patent
Renken et al.

(10) Patent No.: US 7,151,366 B2
(45) Date of Patent: Dec. 19, 2006

(54) INTEGRATED PROCESS CONDITION SENSING WAFER AND DATA ANALYSIS SYSTEM

(75) Inventors: Wayne Glenn Renken, San Jose, CA (US); Earl Jensen, San Jose, CA (US); Roy Gordon, San Jose, CA (US)

(73) Assignee: Sensarray Corporation, Fremont, CA (US)

( * ) Notice: Subject to any disclaimer, the term of this patent is extended or adjusted under 35 U.S.C. 154(b) by 0 days.

(21) Appl. No.: 10/718,269

(22) Filed: Nov. 19, 2003

(65) Prior Publication Data

US 2004/0154417 A1    Aug. 12, 2004

Related U.S. Application Data

(60) Provisional application No. 60/430,858, filed on Dec. 3, 2002, provisional application No. 60/496,294, filed on Aug. 19, 2003, provisional application No. 60/512,243, filed on Oct. 17, 2003.

(51) Int. Cl.
*G01R 31/28* (2006.01)

(52) U.S. Cl. .................................................. 324/158.1
(58) Field of Classification Search ...................... None
See application file for complete search history.

(56) References Cited

U.S. PATENT DOCUMENTS

| | | | |
|---|---|---|---|
| RE32,369 E | 3/1987 | Stockton et al. |
| 5,262,944 A | 11/1993 | Weisner et al. |
| 5,435,646 A | 7/1995 | McArthur |
| 5,444,637 A | 8/1995 | Smesny et al. |
| 5,564,889 A | 10/1996 | Araki |
| 5,969,639 A | 10/1999 | Lauf et al. |
| 5,970,313 A | 10/1999 | Rowland et al. |
| 6,010,538 A | 1/2000 | Sun et al. |
| 6,033,922 A | 3/2000 | Rowland et al. |
| 6,075,909 A | 6/2000 | Ressl |
| 6,100,506 A | 8/2000 | Colelli, Jr. et al. |
| 6,190,040 B1 | 2/2001 | Renken et al. |
| 6,313,903 B1 | 11/2001 | Ogata |
| 6,325,536 B1 | 12/2001 | Renken et al. |
| 6,377,130 B1 | 4/2002 | Haman |
| 6,377,870 B1 | 4/2002 | Blaesing-Bangert et al. |
| 6,378,378 B1 | 4/2002 | Fisher |
| 6,424,141 B1 | 7/2002 | Hollman et al. |
| 6,472,240 B1 | 10/2002 | Akram et al. |
| 6,542,835 B1 | 4/2003 | Mundt |
| 6,553,277 B1 | 4/2003 | Yagisawa et al. |

(Continued)

FOREIGN PATENT DOCUMENTS

EP           1014437 A2      6/2000

(Continued)

OTHER PUBLICATIONS

U.S. Appl. No. 60/354,551, filed Feb. 6, 2002, to Ramsey et al., entitled "Wafer-Like Sensor".

(Continued)

*Primary Examiner*—Jermele Hollington
(74) *Attorney, Agent, or Firm*—Parsons Hsue & de Runtz LLP

(57) ABSTRACT

A process condition measuring device and a handling system may be highly integrated with a production environment where the dimensions of the process condition measuring device are close to those of a production substrate and the handling system is similar to a substrate carrier used for production substrates. Process conditions may be measured with little disturbance to the production environment. Data may be transferred from a process condition measuring device to a user with little or no human intervention.

25 Claims, 18 Drawing Sheets

U.S. PATENT DOCUMENTS

| | | | |
|---|---|---|---|
| 6,691,068 B1 | 2/2004 | Freed et al. | 702/187 |
| 6,790,763 B1 * | 9/2004 | Kondo et al. | 438/622 |
| 6,807,503 B1 | 10/2004 | Ye et al. | |
| 6,828,225 B1 * | 12/2004 | Kondo et al. | 438/622 |
| 6,842,025 B1 * | 1/2005 | Gershenzon et al. | 324/759 |
| 6,889,568 B1 | 5/2005 | Renken | |
| 6,916,147 B1 * | 7/2005 | Suh et al. | 414/416.08 |
| 2001/0014520 A1 | 8/2001 | Usui et al. | |
| 2002/0078770 A1 | 6/2002 | Hunter | |
| 2002/0109590 A1 | 8/2002 | Parsons | |
| 2002/0118009 A1 | 8/2002 | Hollman et al. | |
| 2002/0148307 A1 | 10/2002 | Jonkers | |
| 2002/0161557 A1 | 10/2002 | Freed | |
| 2002/0172097 A1 | 11/2002 | Freed | |
| 2002/0177916 A1 | 11/2002 | Poolla | |
| 2002/0177917 A1 | 11/2002 | Poolla | |
| 2002/0193957 A1 | 12/2002 | Freed | |
| 2003/0077153 A1 | 4/2003 | Elliott et al. | |
| 2003/0209097 A1 | 11/2003 | Hunter | |
| 2003/0223057 A1 | 12/2003 | Ramsey et al. | 356/147 |
| 2004/0107066 A1 | 6/2004 | Poolla et al. | |
| 2004/0131226 A1 | 7/2004 | Poolla | |
| 2004/0225462 A1 * | 11/2004 | Renken et al. | 702/94 |
| 2004/0249604 A1 | 12/2004 | Poolla et al. | |
| 2004/0267501 A1 | 12/2004 | Freed et al. | 702/184 |
| 2005/0126315 A1 | 6/2005 | Hunter | |

FOREIGN PATENT DOCUMENTS

| | | |
|---|---|---|
| WO | WO00/68986 | 11/2000 |
| WO | WO02/17030 A2 | 2/2002 |
| WO | WO02/17030 A3 | 2/2002 |
| WO | WO 03/067183 | 8/2003 |
| WO | WO2004/051713 A2 * | 6/2004 |

OTHER PUBLICATIONS

U.S. Appl. No. 60/525,710, filed Nov. 29, 2003, to Mundt et al., entitled "Sensor Apparatus Automated Management Methods and Apparatus".

International Preliminary Examination Report from corresponding Appln. No. PCT/US03/37836, dated Oct. 7, 2004 (7 pages).

"Notification of Transmittal of the International Search Report or the Declaration", corresponding to PCT/US03/37836, International Searching Authority, European Patent Office, Sep. 27, 2004, 6 pages.

"Invitation to Pay Additional Fees" corresponding to PCT/US03/3786 including Annex to Form PCT/ISA/206 "Communication Relating to the Results of the Partial International Search", International Searching Authority, European Patent Office, Jun. 17, 2007, 5 pages.

U.S. Appl. No. 60/285,613, filed Apr. 19, 2001; Freed et al.; "Firmware, Methods, Apparatus, and Computer Program Products for Wafer Sensors".

U.S. Appl. No. 60/285,439, filed Apr. 19, 2001; Freed et al.; "Methods Apparatus, and Computer Program Products for Obtaining Data for Process Operation, Optimization, Monitoring, and Control".

Freed et al.; "Autonomous On-Wafer Sensors for Process Modeling, Diagnosis, and Control," IEEE Transactions on Semiconductor Manufacturing, vol. 14, No. 3, Aug. 2001, pp. 255-264.

Freed; "Wafer-Mounted Sensor Arrays for Plasma Etch Processes", Dissertation, Univ. of CA. Berkeley, Fall 2001.

Baker et al.; "A Novel In Situ Monitoring Technique for Reactive Ion Etching Using a Surface Micromachined Sensor," IEEE Transactions on Semiconductor Manufacturing, vol. 11, No. 2, May 1998, pp. 254-264.

"Invitation to Pay Additional Fees" issued in corresponding PCT/US05/014832 including Annex to Form PCT/ISA/206 "Communication Relating to the Results of the Partial International Search," International Searching Authority, European Patent Office, Apr. 8, 2005, 5 pages.

"Notification of Transmittal of the International Search Report and the Written Opinion of the International Searching Authority, or the Declaration" issued in corresponding PCT/US05/014832, dated Oct. 12, 2005, 16 pages.

* cited by examiner

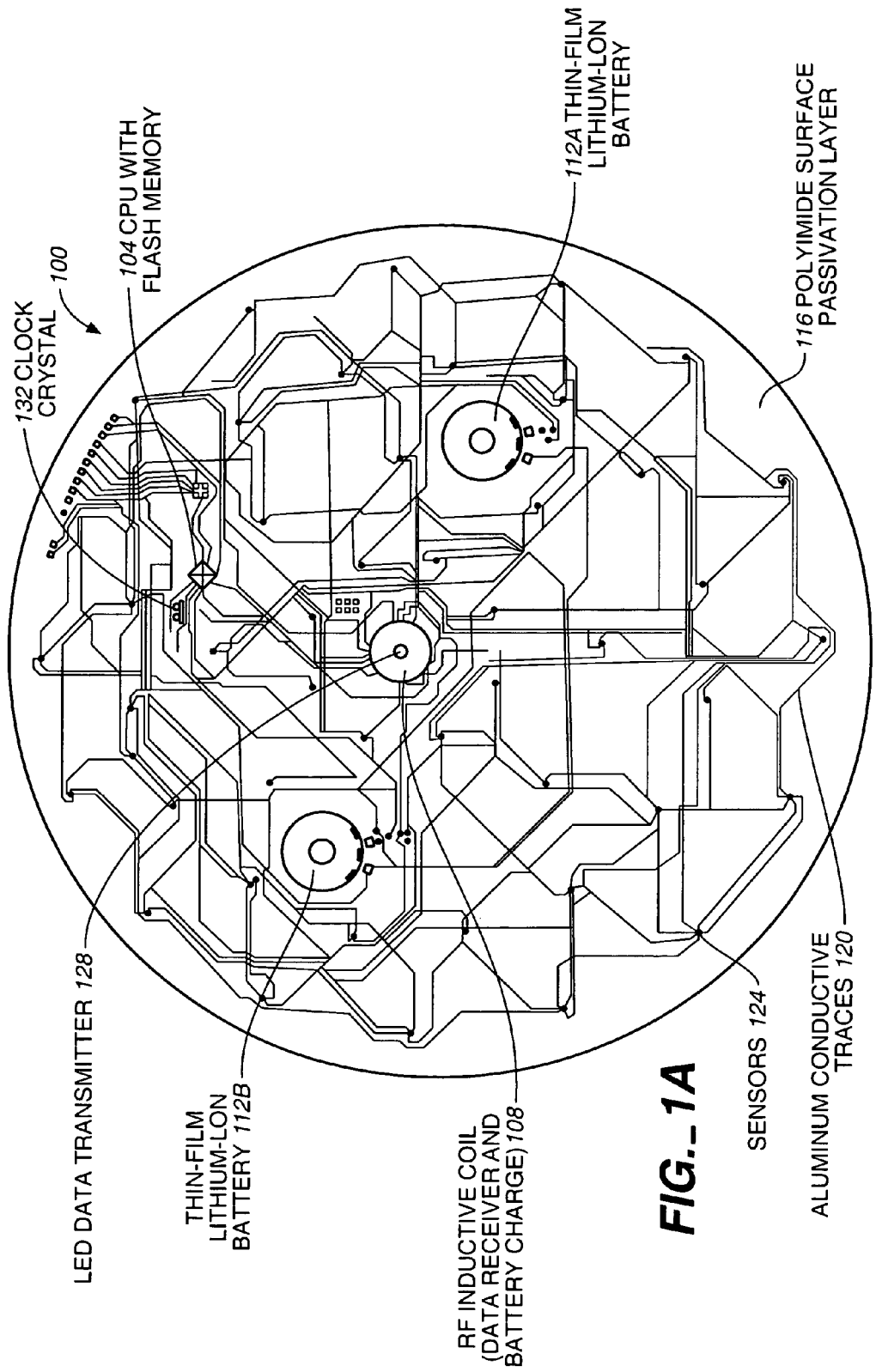
FIG._1A

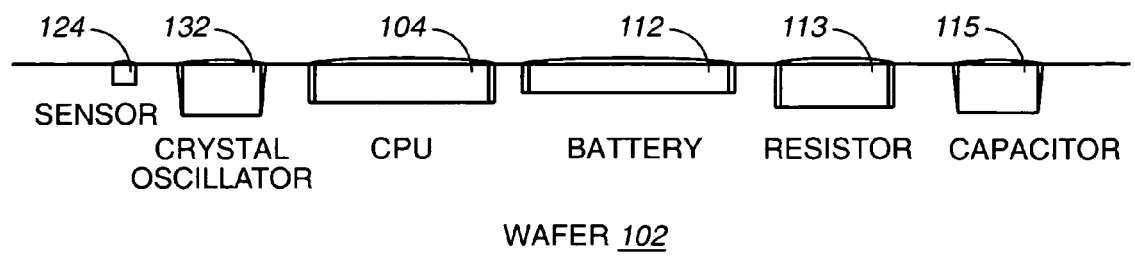
FIG._1B
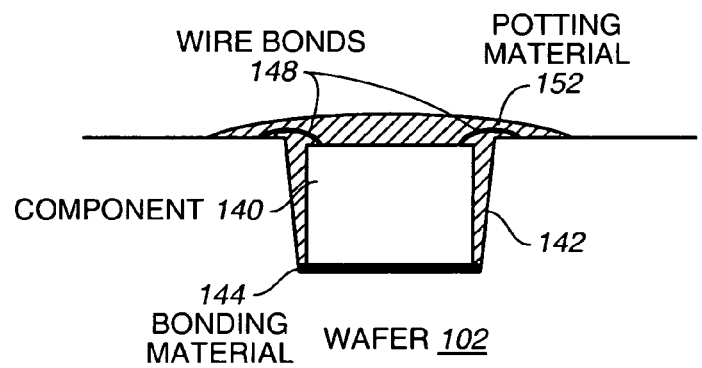
FIG._1C

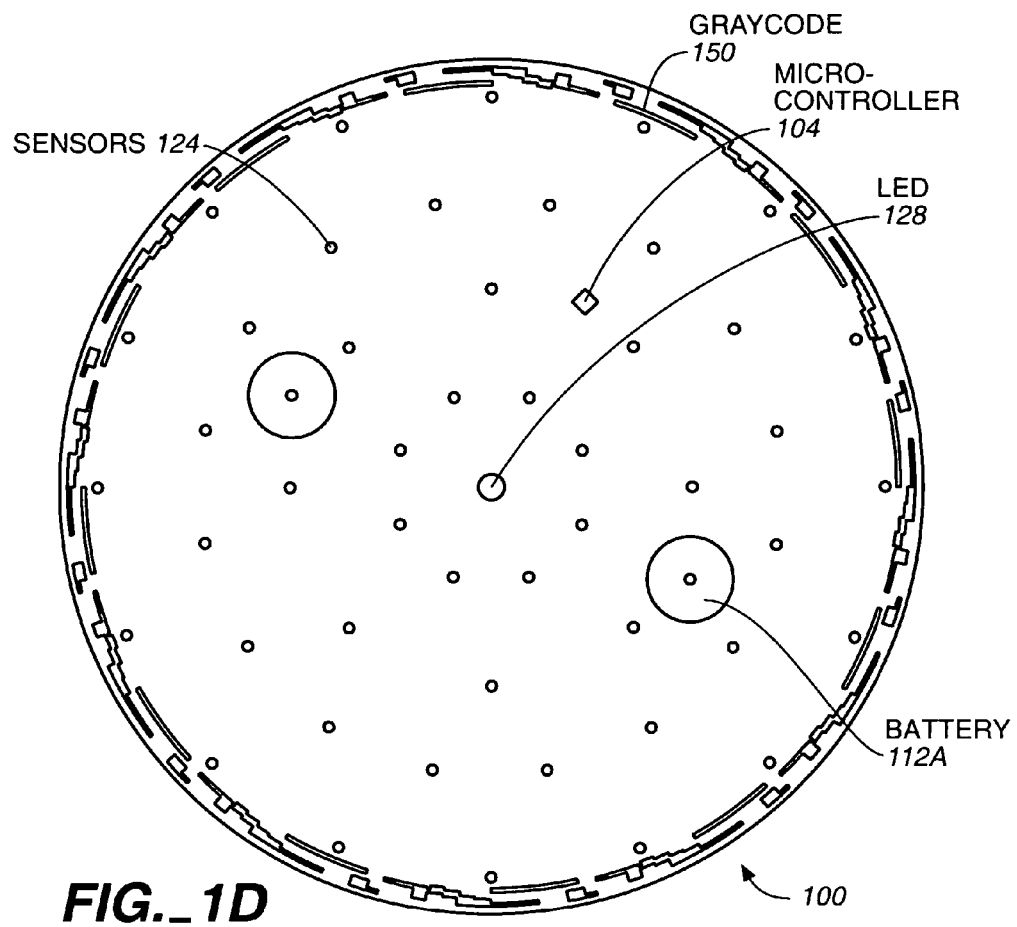
FIG._1D
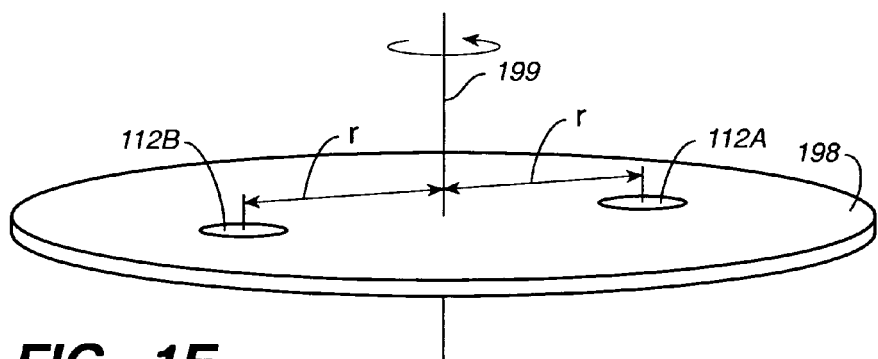
FIG._1E

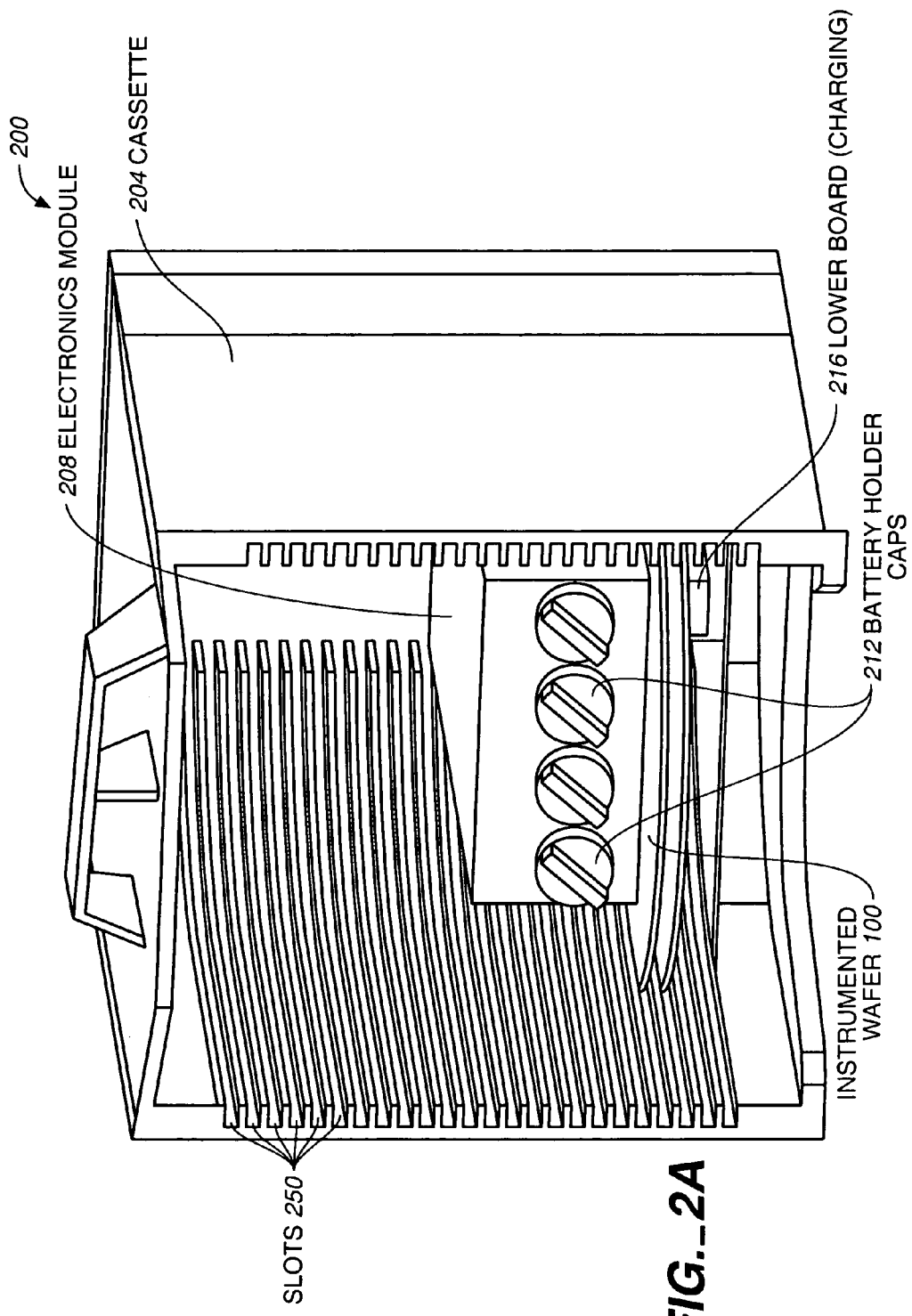
FIG._2A

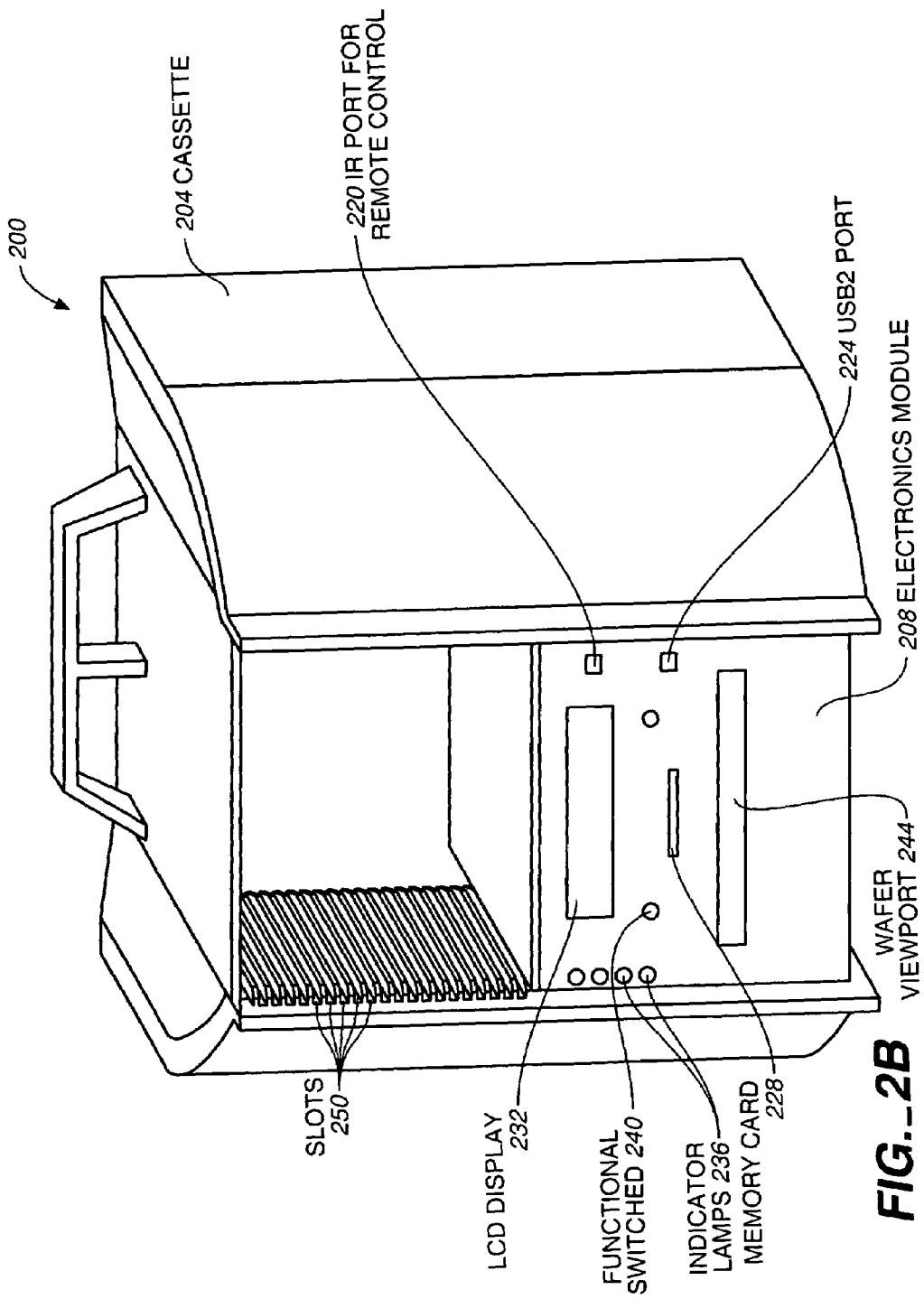

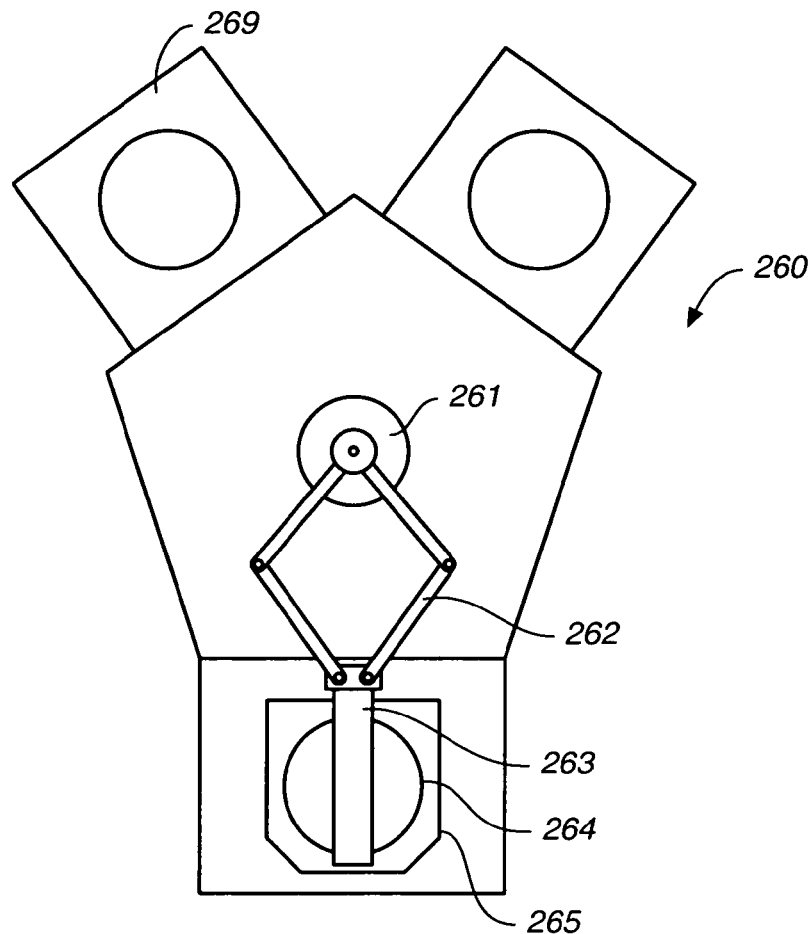
FIG._2C
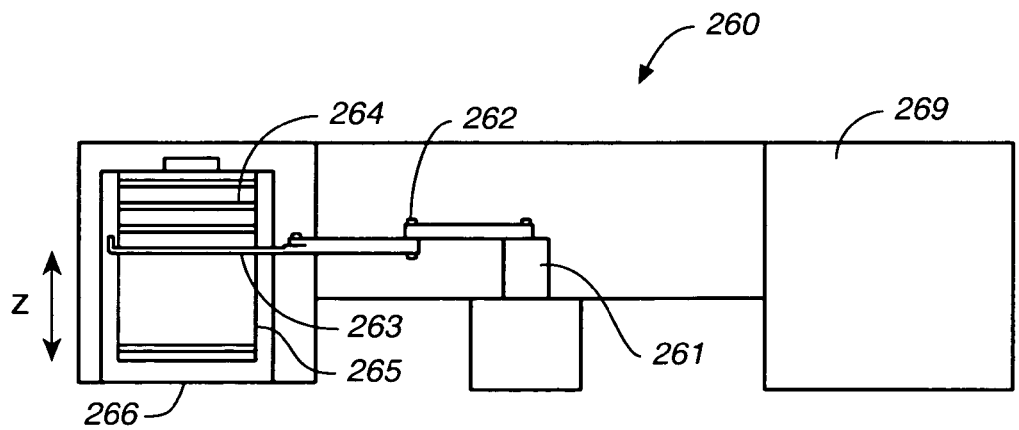
FIG._2D

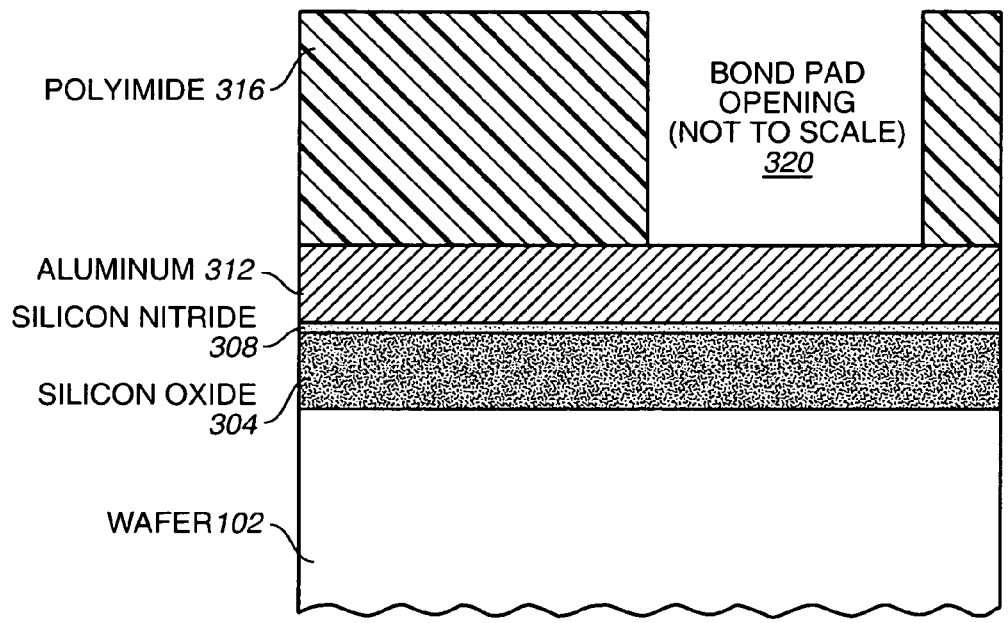
FIG._3A
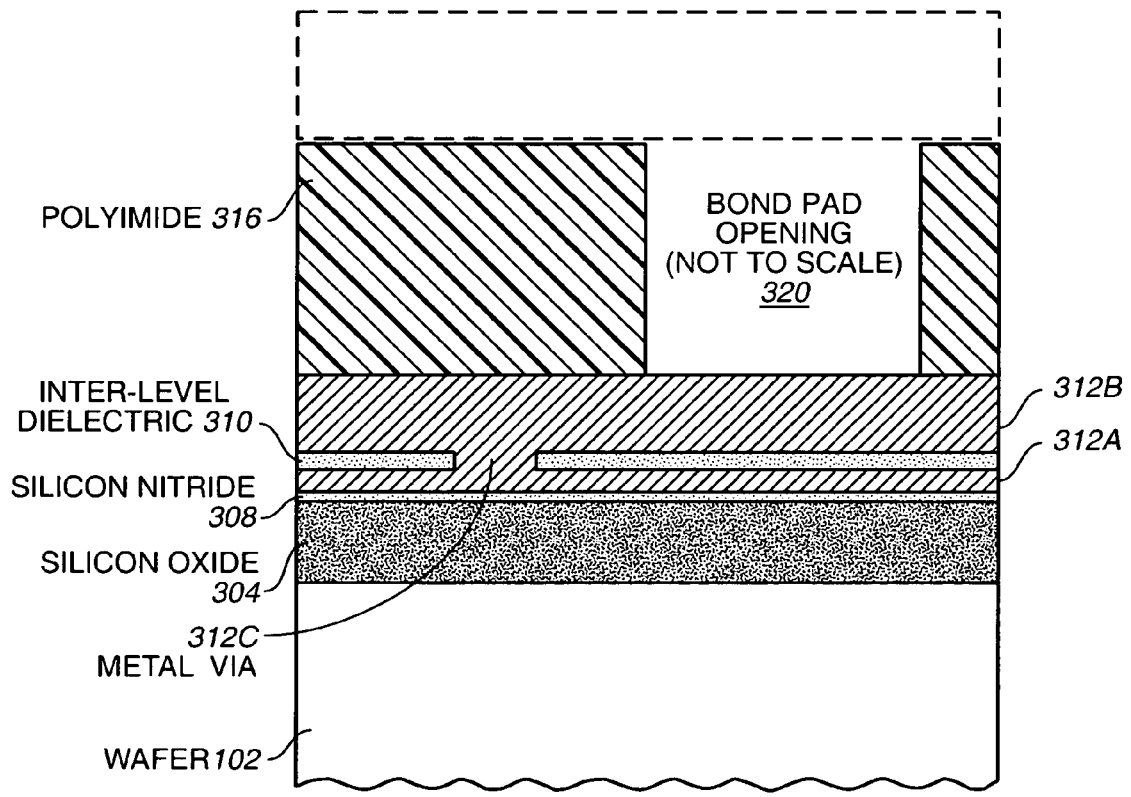
FIG._3B

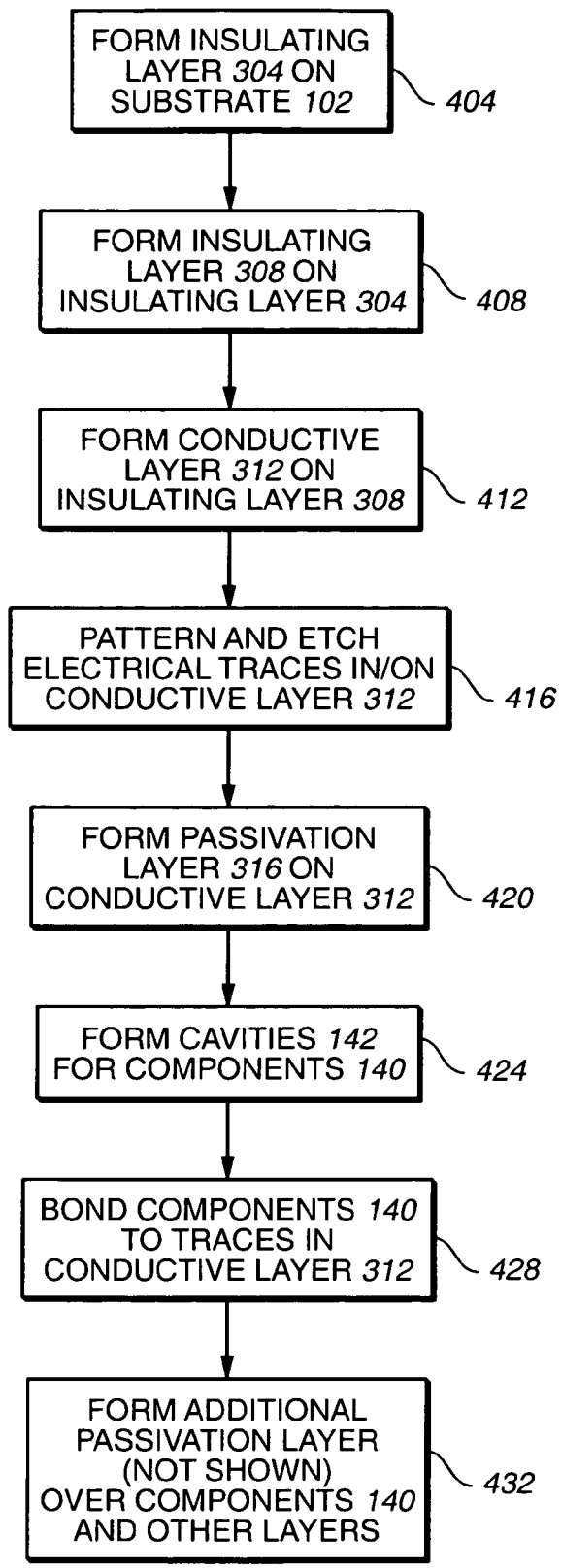
*FIG._4A*

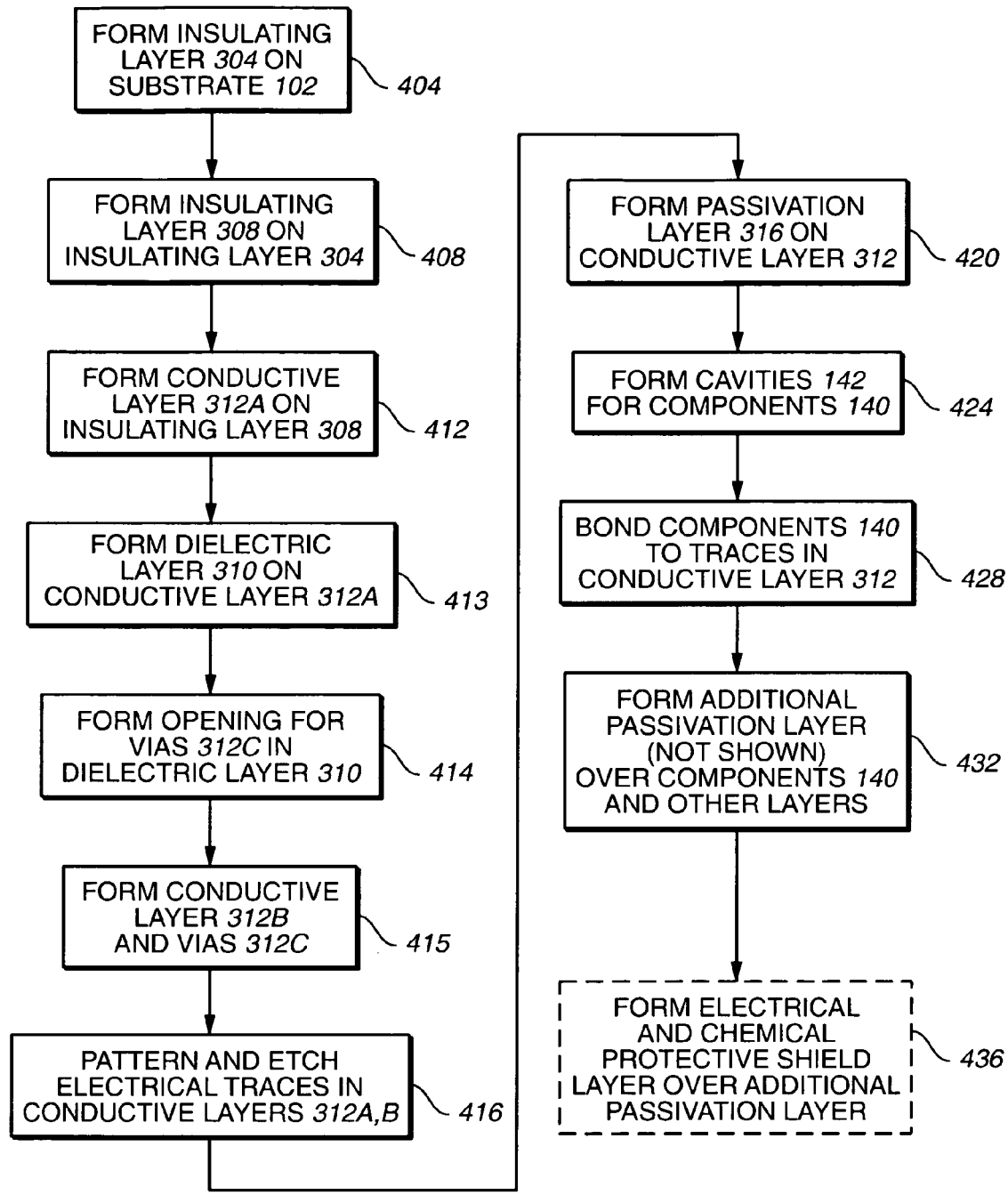
FIG._4B

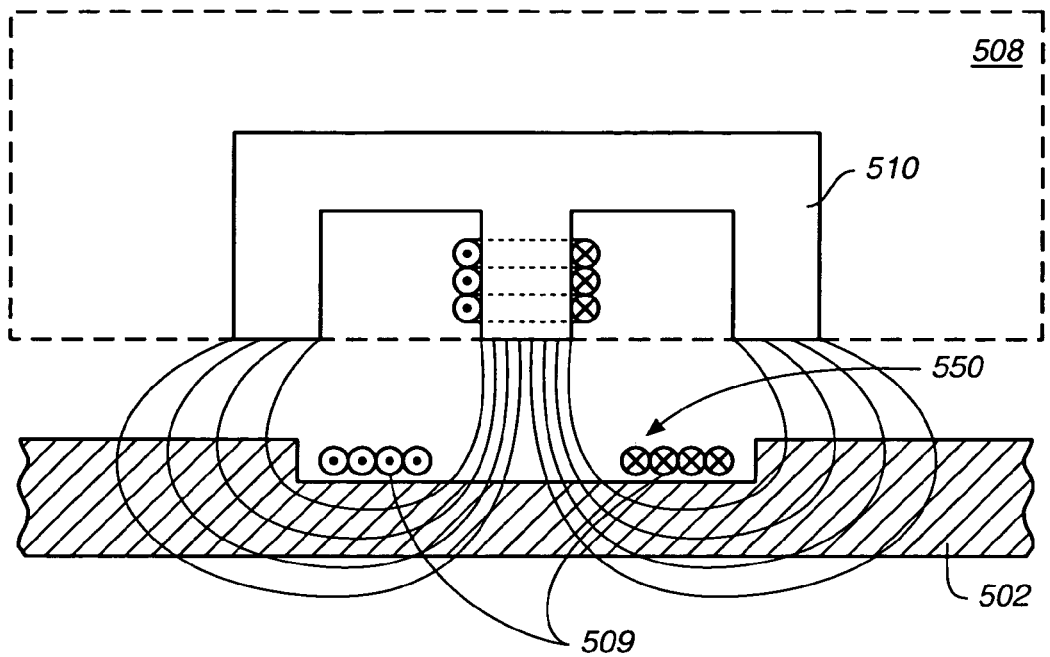
FIG._5A
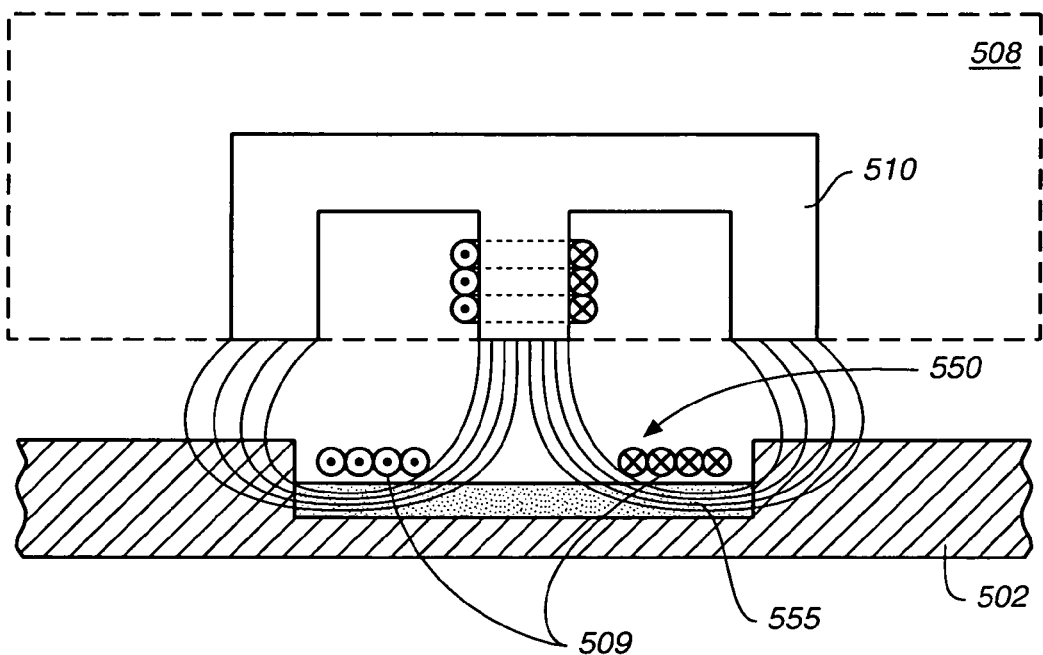
FIG._5B

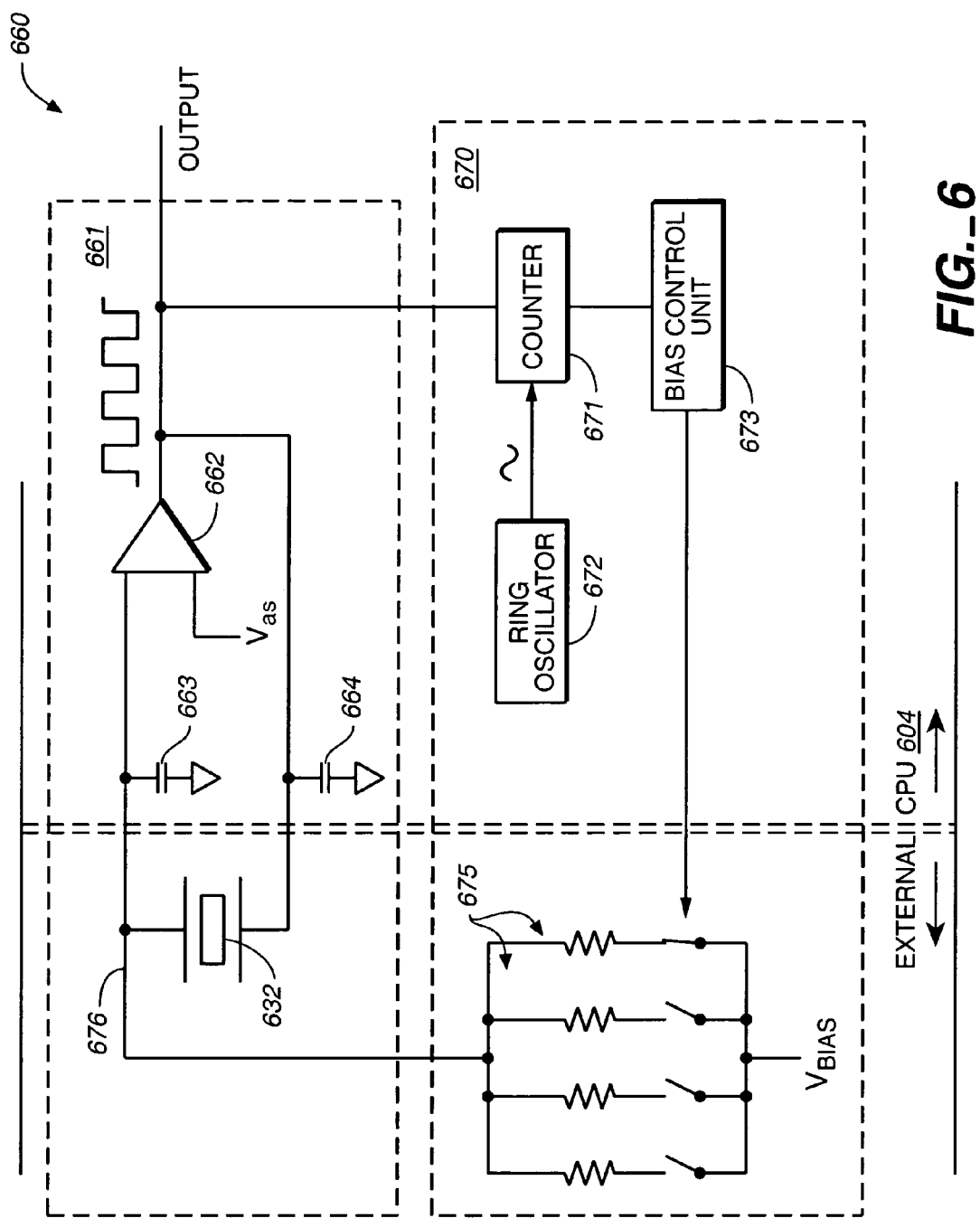
FIG._6

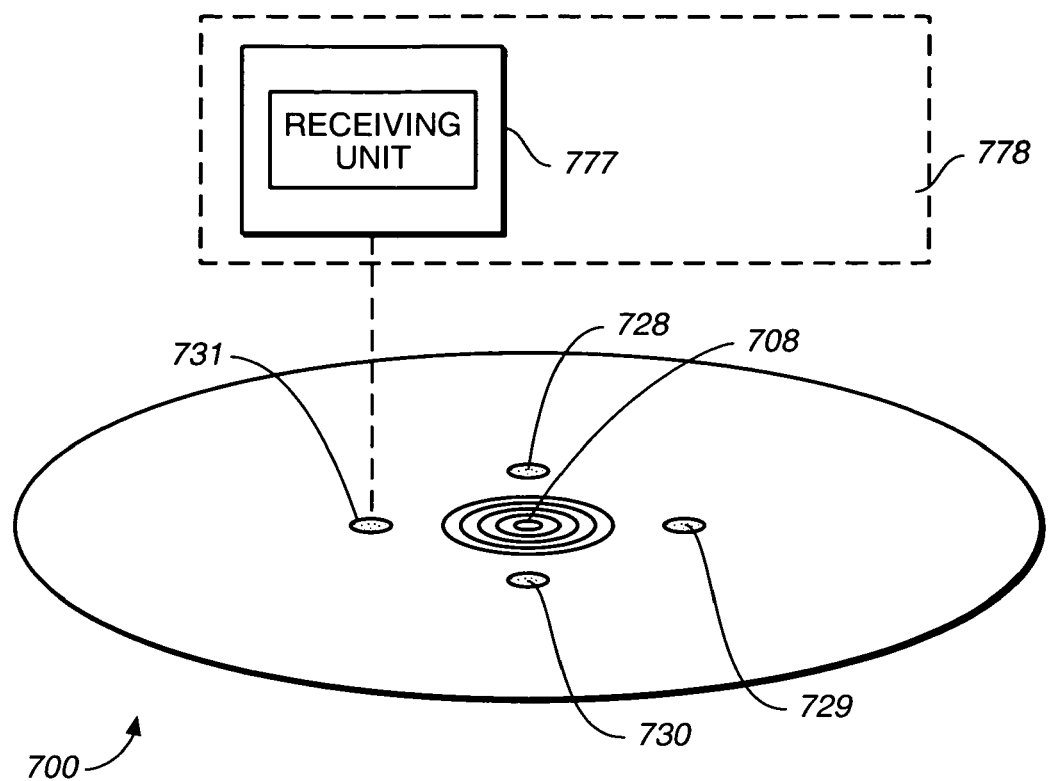
FIG._7

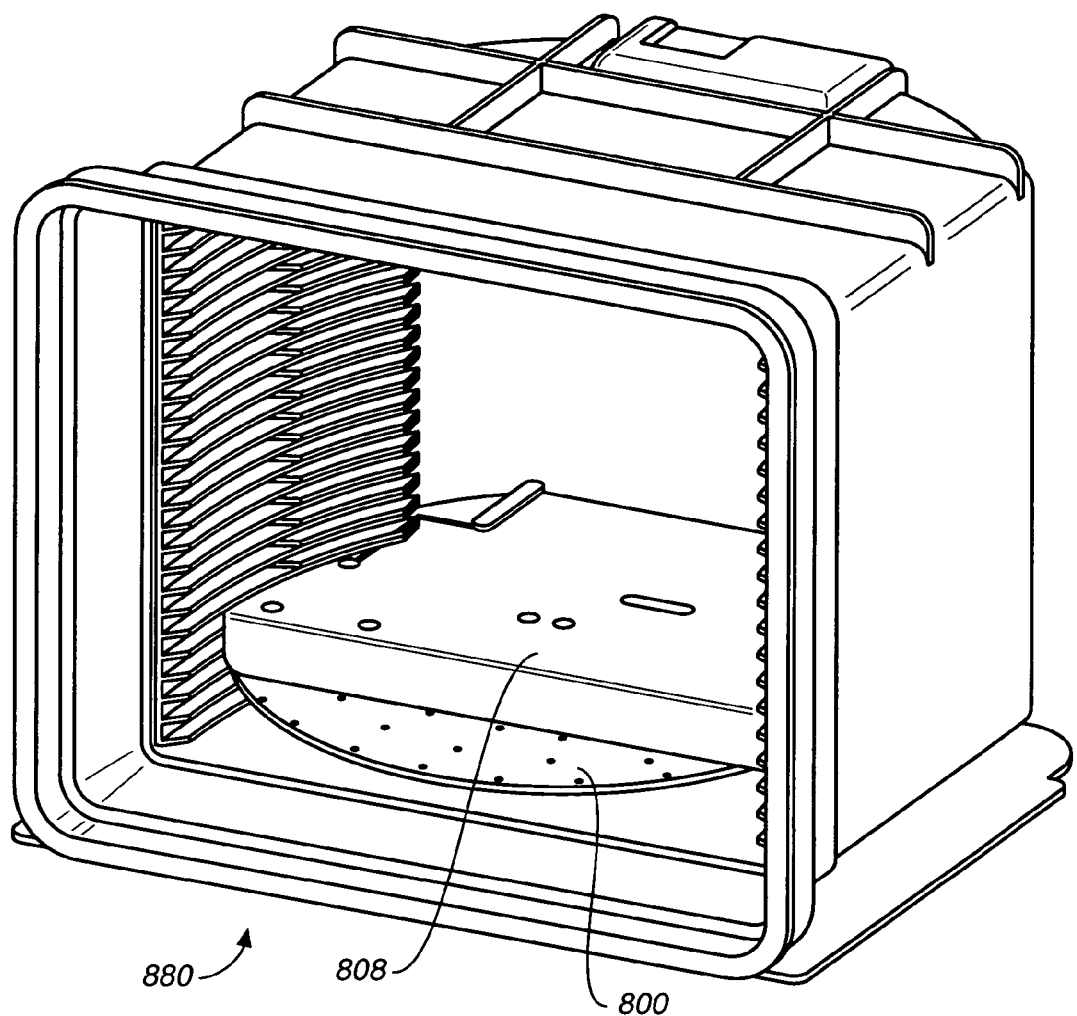
FIG._8A

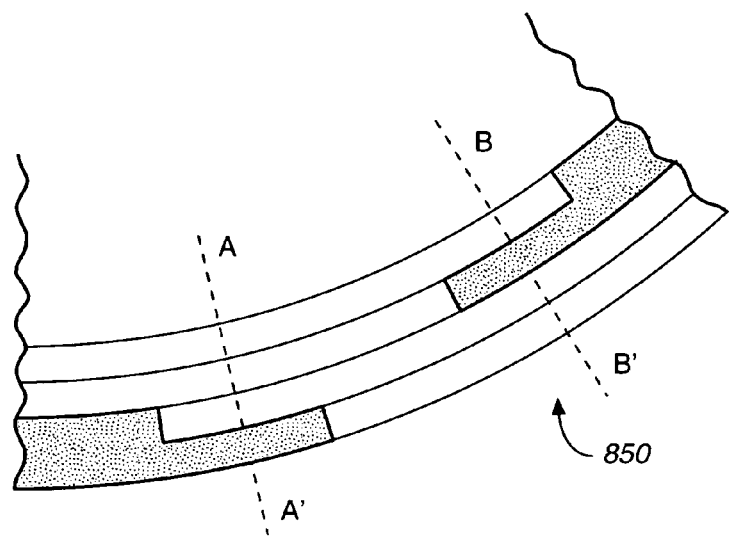
FIG._8B
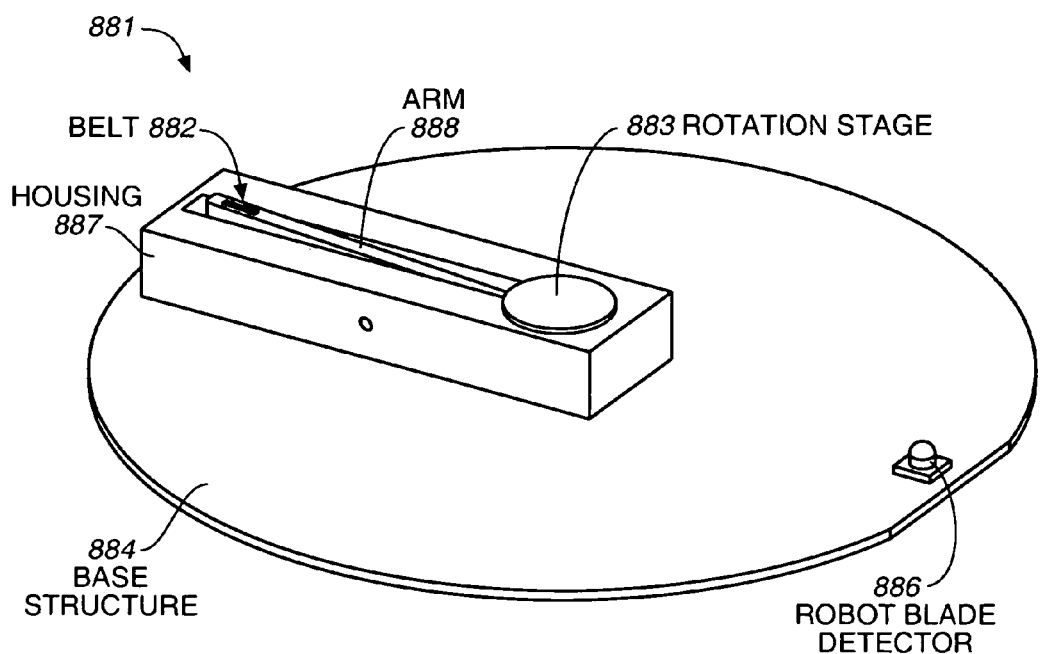
FIG._8C

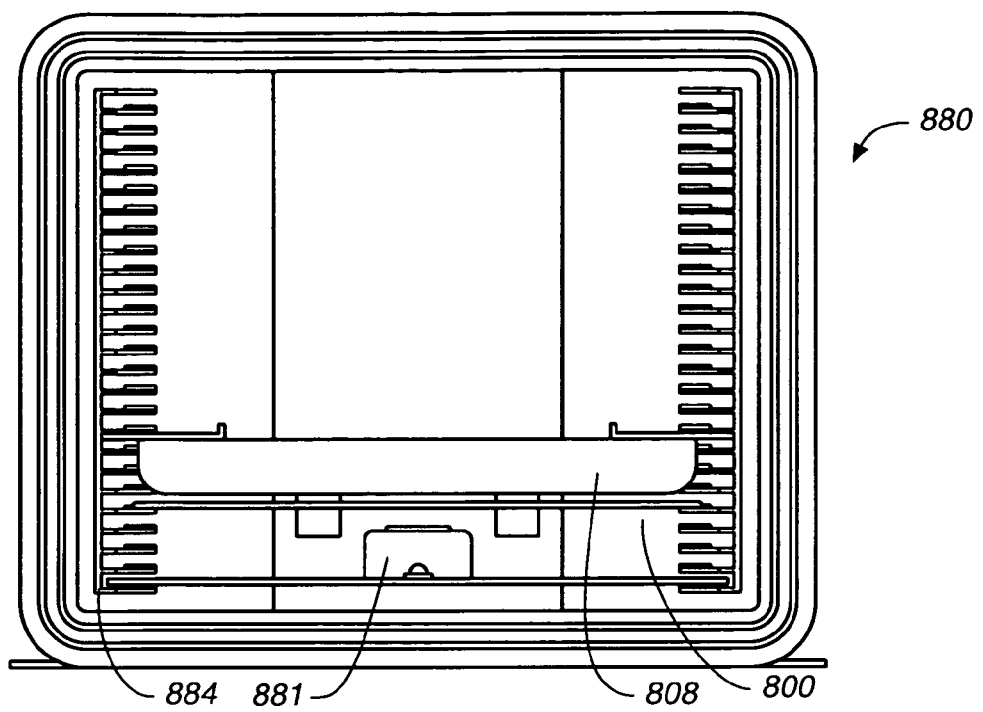
WAFER IN SLOT READY TO PICK UP
FIG._8D
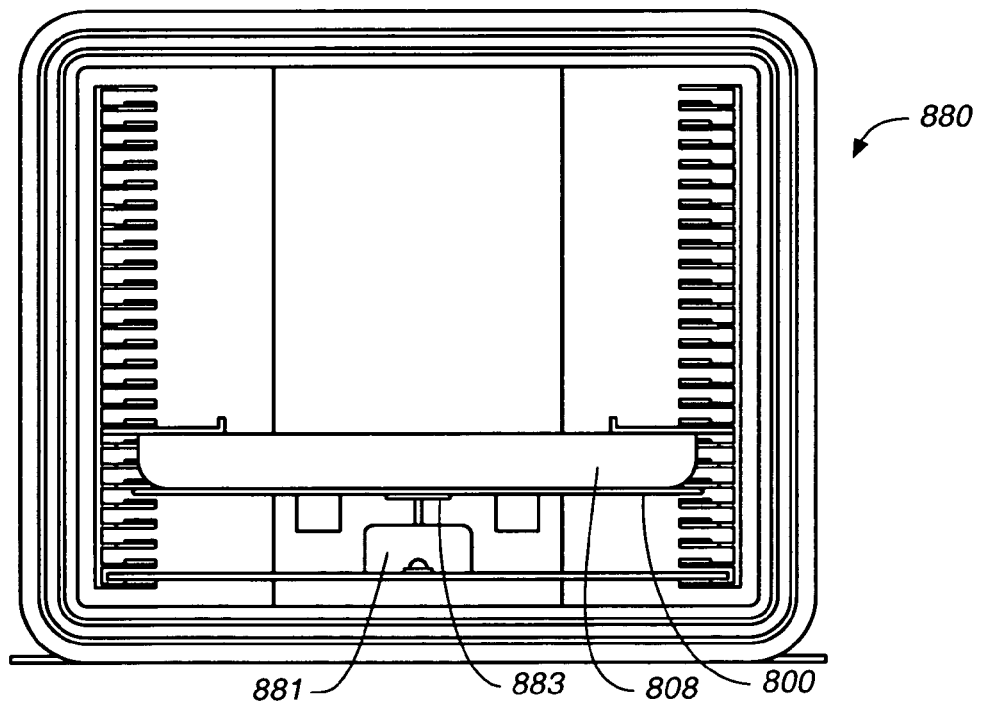
WAFER RAISED FOR ROTATION ALIGMENT AND CHARGING
FIG._8E

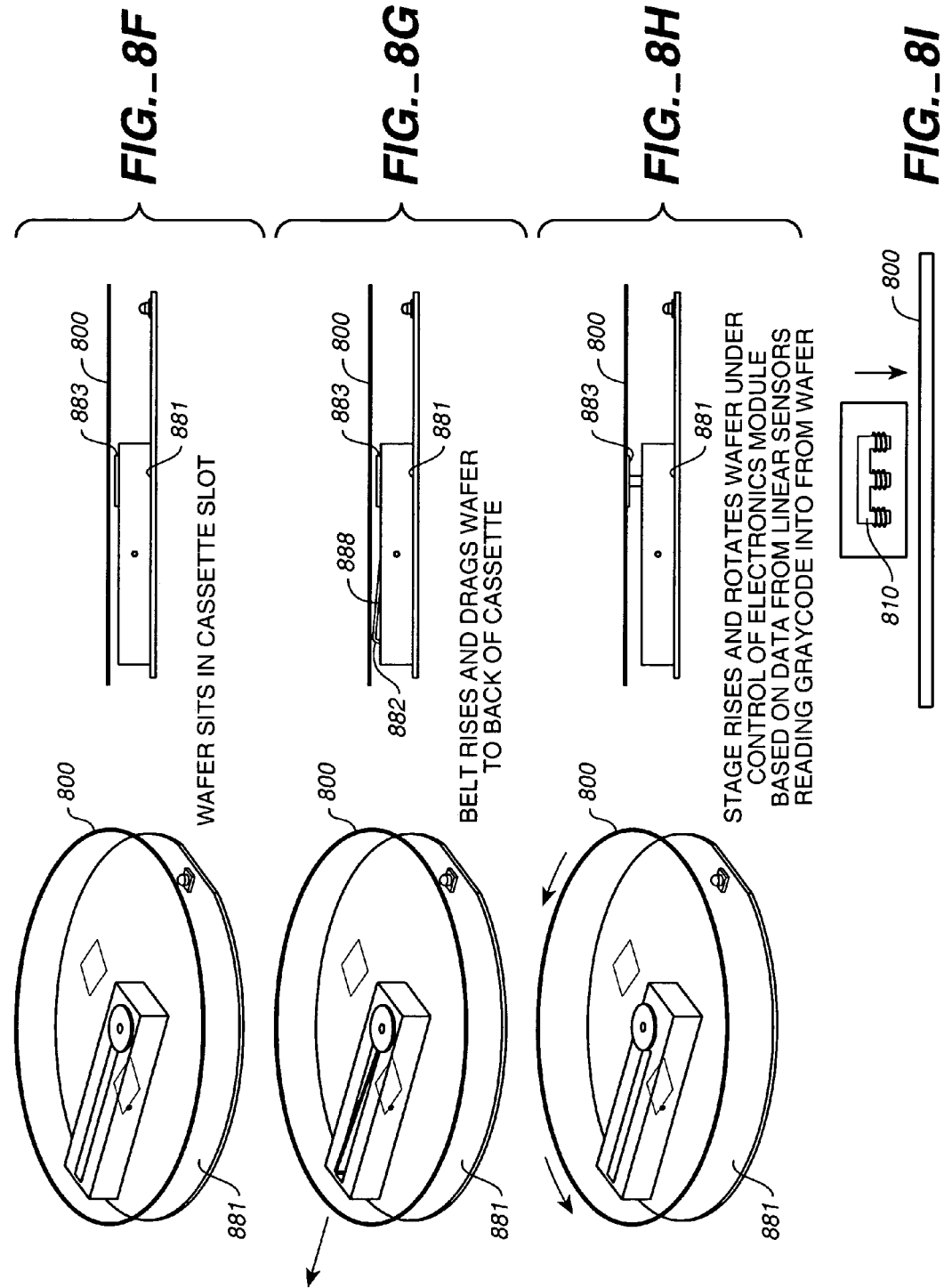

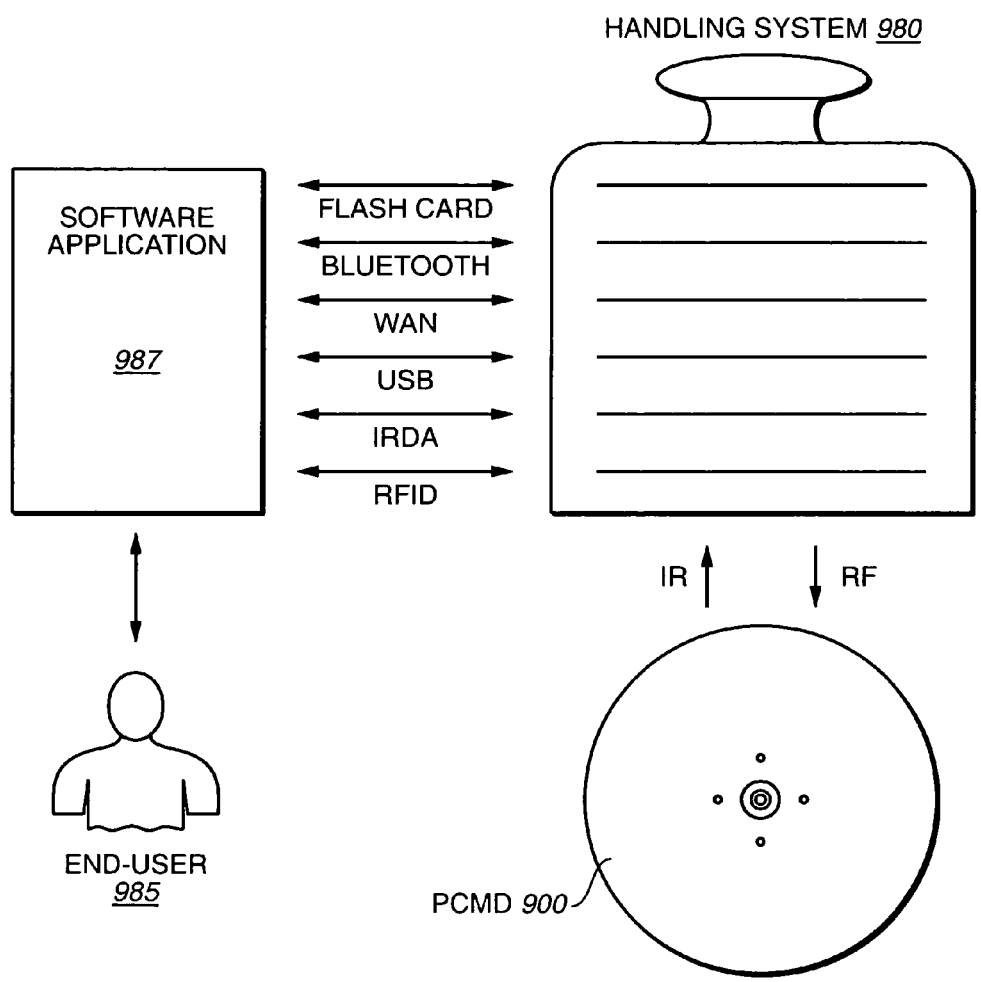
FIG._9

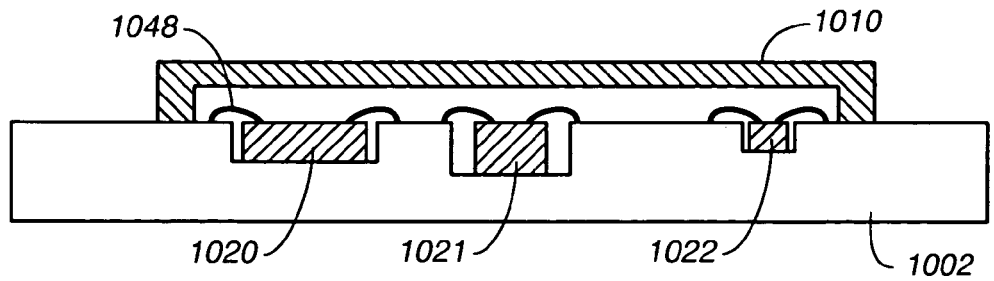
FIG._10A
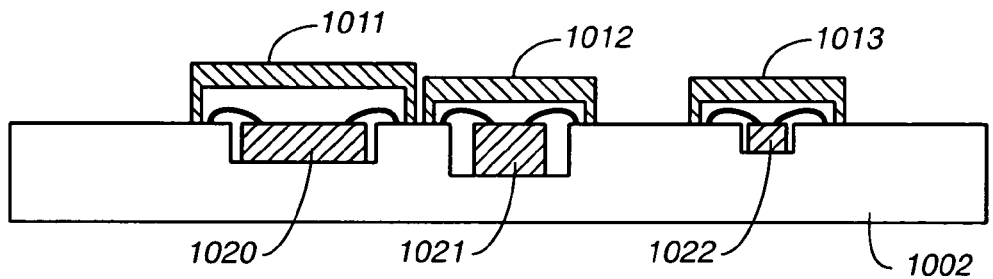
FIG._10B
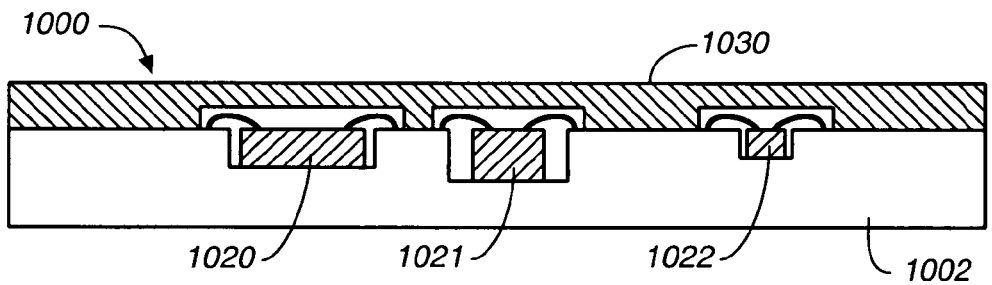
FIG._10C
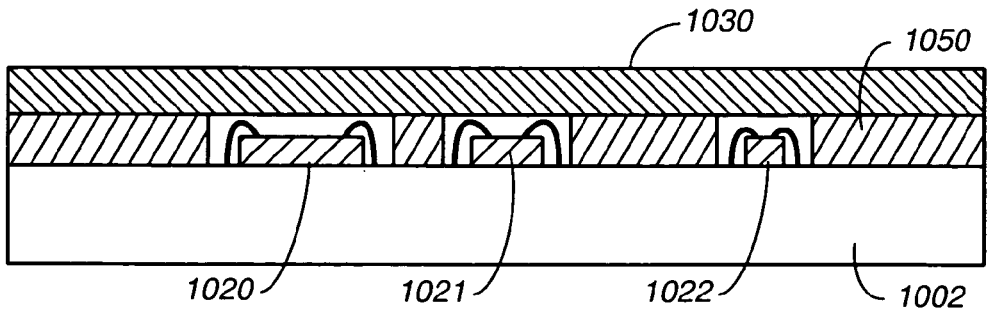
FIG._10D

INTEGRATED PROCESS CONDITION SENSING WAFER AND DATA ANALYSIS SYSTEM

CROSS-REFERENCE TO RELATED APPLICATIONS

This application claims the benefit of U.S. Provisional Patent Application No. 60/430,858 filed on Dec. 3, 2002; U.S. Provisional Patent Application No. 60/496,294 filed on Aug. 19, 2003; U.S. Provisional Patent Application No. 60/512,243 filed on Oct. 17, 2003.

BACKGROUND OF THE INVENTION

1. Field of the Invention

The present invention relates to semiconductor wafer processing, LCD display glass substrate processing, magnetic memory disc processing, and other devices fabricated from thin film processes, and, more specifically, to a system that can sense and record processing conditions and transmit data to a receiver.

2. Discussion of the Related Art

The fabrication of an integrated circuit, display or disc memory generally employs numerous processing steps. Each process step must be carefully monitored in order to provide an operational device. Throughout the imaging process, deposition and growth process, etching and masking process, etc., it is critical, for example, that temperature, gas flow, vacuum, pressure, chemical, gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely.

Within a processing chamber, processing conditions vary. The variations in processing conditions such as temperature, gas flow rate and/or gas composition greatly affect the formation and, thus, the performance of the integrated circuit. Using a substrate to measure the processing conditions that is of the same or similar material as the integrated circuit or other device provides the most accurate measure of the conditions because the material properties of the substrate is the same as the actual circuits that will be processed. Gradients and variations exist throughout the chamber for virtually all process conditions. These gradients, therefore, also exist across the surface of a substrate, as well as below and above it. In order to precisely control processing conditions at the wafer, it is critical that measurements be taken upon the wafer and the readings be available in real time to an automated control system or operator so that the optimization of the chamber processing conditions can be readily achieved. Processing conditions include any parameter used to control semiconductor or other device fabrication or any condition a manufacturer would desire to monitor.

Within the processing chamber a robot transports the test wafer or substrate. One example of a device incorporating a robot is manufactured by the TEL Corporation. For more information about the robot and processing chamber, please refer to U.S. Pat. No. 5,564,889 to Araki, entitled "Semiconductor Treatment System and Method for Exchanging and Treating Substrate," which is hereby incorporated by this reference in its entirety. This application relates to U.S. Provisional Patent Application No. 60/430,858 filed on Dec. 3, 2002; U.S. Provisional Patent Application No. 60/496,294 filed on Aug. 19, 2003; U.S. Provisional Patent Application No. 60/512,243 entitled "Integrated Process Condition Sensing Wafer and Data Analysis System" by Wane Renken et al, filed on Oct. 17, 2003; and to U.S. patent application Ser. No. 10/056,906 to Renken, which are hereby incorporated by this reference in their entirety.

SUMMARY OF THE INVENTION

A process condition measuring device (PCMD) is disclosed that may be delivered to a target environment, acquire a wide range of data and return to a handling system with little disruption to the target environment or the tool containing the target environment. The PCMD is designed to have similar characteristics to the substrates normally handled by the tool. The characteristics of such substrates are generally specified by industry standards. Thus, for a system designed for 300 mm silicon wafers, the PCMD has a silicon substrate and has similar physical dimensions to those of a 300 mm wafer. Components may be located within cavities in the substrate to keep the profile of the PCMD the same as, or close to that of a 300 mm wafer. Because of its dimensions and its wireless design, the PCMD may be handled by a robot as if it were a 300 mm wafer. It may undergo the process steps undergone by wafers such as etch, clean, photolithography etc. The PCMD records process conditions such as temperature, pressure and gas flow rate during processing and uploads the data when requested. Conditions during transport and storage may also be monitored and recorded.

Making a PCMD employs multiple process steps similar to those used in semiconductor IC manufacturing. An insulating layer is deposited over the substrate. A conductive layer is deposited and patterned to form traces. Cavities are formed in the substrate surface and components are placed in those cavities. Components are then bonded to traces to form electrical connections. A passivation layer may then be deposited over the surface to protect the substrate, components and the wire bonds.

PCMDs may be made compatible with harsh environments by protecting components from chemical or electrical damage. Critical components may have covers similar to parts used in packaging ICs. Covers may also be made of specialized materials such as sapphire or, for electrical protection, silicon or metal. PCMDs may also be adapted to high temperatures by incorporating a temperature compensating circuit to allow an oscillator to perform outside its specified temperature range.

A handling system provides a base for a PCMD. The PCMD exchanges data with an electronics module when it is docked in the handling system and also receives power from the electronics module. The handling system may comprise an electronics module within a standard substrate carrier such as a front opening unified pod (FOUP). This allows the handling system to be highly integrated with a tool or with facility automation. The PCMD may be moved to and from the FOUP by the tool and the FOUP may be moved from one tool to another by the facility automation. The FOUP provides a clean environment for the PCMD where it may be stored or transported. In addition, loading stations for FOUPs are normally provided with RFID readers to determine the identity of the FOUP and relay the information to a tracking system via a network. By connecting the electronics module in the FOUP to an RFID transceiver, data from the electronics module may be sent to the network where it may be accessed.

A handling system may have an alignment module that may move a PCMD within a handling system. Vertical and rotational motion of a PCMD may be achieved by a rotation stage or wheels supporting its perimeter. Raising a PCMD may allow better coupling to the electronics module. Lateral movement of the PCMD may be achieved by a moving belt or wheel that is brought into contact with the lower surface of the PCMD to move the PCMD into position.

A PCMD may have a pattern on its surface that allows its orientation to be determined. Greycode printed on the edge of a surface of a PCMD may allow the rotational orientation of the PCMD to be determined. Greycode readers may be installed in a handling system so that the orientation of the PCMD is known before it is sent on a survey and after it returns. Such a system does not require movement of the PCMD relative to the readers in order to determine orientation.

A PCMD may have temperature compensation circuitry to allow components to operate at high temperatures. An oscillator within a clock circuit may have its bias adjusted as the temperature changes so that the oscillator continues to function beyond its specified temperature range.

BRIEF DESCRIPTION OF THE FIGURES

FIG. 1A is a plan view of Process Condition Measuring Device ("PCMD") 100.

FIG. 1B is a depiction of components within PCMD 100.

FIG. 1C is a cross section of a single component within PCMD 100.

FIG. 1D is a plan view of an embodiment of PCMD 100 with graycode coding.

FIG. 1E shows PCMD 100 spinning about a central axis 199.

FIG. 2A is a perspective view of the back of Handling System ("HS") 200.

FIG. 2B is a perspective view of the front of HS 200.

FIG. 2C is a processing tool 260 having a robot that transfers substrates between a substrate carrier and a processing chamber.

FIG. 2D is a cross-sectional view of processing tool 260.

FIG. 3A is a cross section of an embodiment of PCMD 100.

FIG. 3B is a cross section of another embodiment of PCMD 100.

FIG. 4A is a flowchart depicting the steps of making the cross section shown in FIG. 3A.

FIG. 4B is a flowchart depicting the steps of making the cross section shown in FIG. 4A.

FIG. 5A is a cross-section of an E-coil 510 inductively charging a coil 508.

FIG. 5B is a cross-section of an E-coil 510 inductively charging a coil 508 with a magnetic conductive layer 555.

FIG. 6 is a circuit diagram of a high temperature crystal oscillator circuit 660.

FIG. 7 shows a PCMD 700 having four transmitters 728–731.

FIG. 8A shows a handling system 880

FIG. 8B shows a portion of a PCMD having greycode 850.

FIG. 8C shows an alignment module 881.

FIG. 8D shows handling system 880 with PCMD 800 in the normal position.

FIG. 8E shows handling system 880 with PCMD 800 in the raised position.

FIG. 8F shows alignment module 881 with PCMD 800.

FIG. 8G shows alignment module 881 moving PCMD 800 laterally.

FIG. 8H shows alignment module 881 raising and rotating PCMD 800.

FIG. 8I shows E-coil 810 moving vertically towards PCMD 800.

FIG. 9 shows various communication systems between PCMD 900, handling system 980 and software application 987.

FIG. 10 shows different examples of lids protecting components of PCMDs.

DETAILED DESCRIPTION

The measurement system in one embodiment measures processing conditions in various locations of a wafer or substrate and records them in memory for later transmission or downloading of the process conditions. In another embodiment of the measurement system where a processing chamber has windows capable of data transmission, the system is additionally capable of transmitting the processing conditions in real time to a data processing device.

FIG. 1A illustrates process condition measuring device ("PCMD") 100, an embodiment of the present invention. PCMD 100 is part of a process measurement system, the other components of which will be described later with reference to FIG. 2. PCMD 100 comprises a substrate such as a silicon wafer, glass substrate, or other substrates well known in the art. Substrate 102 (not visible in plan view) is preferably a silicon wafer and may be of any diameter but is preferably an 8, 10, or 12 inch diameter wafer.

A number of components are integrated to form PCMD 100. Sensors 124 are distributed about PCMD 100 and are, therefore, capable of detecting gradients in various processing conditions across the surface of the substrate. Sensors 124 are connected to the microprocessor 104 through conductive traces 120. Conductive traces 120 preferably comprise aluminum, but may comprise any conductive material, the formation of PCMD 100, including the conductive traces and the other components will be described later with reference to FIGS. 3 and 4. Microprocessor 104 preferably includes flash memory cells for storing the processing conditions and other instructions necessary for the operation of PCMD 100. However, the flash, or other type memory, may alternatively be part of a discrete EPROM or EEPROM rather than being an integral part of microprocessor 104. Clock crystal 132 generates a timing signal used in various operations of PCMD 100. Transmitter 128 preferably comprises a light emitting diode (LED) for transmitting data. Around transmitter 108 is a radio frequency (RF) inductive coil 108 receives data and serves to inductively charge power sources 112A and 112B. In one embodiment of the invention, transmitter 128 may also act as a transceiver and receive data as well as transmit data. Additionally, coil 108 may also act not only as a receiver, but also as a transmitter. Thus, coil 108 may serve as a receiving unit that may receive both data and power.

In the embodiment illustrated, power sources 112A and 112B are thin film lithium ion batteries that are equidistant from the center of the PCMD 100. The thin 0.25 mm thick power sources allow for a thin overall PCMD structure with a thickness of 0.70 mm, which is comparable to a production wafer and compatible with the robot arms typically used in wafer handling procedures. These power sources have previously been common to under-skin medical implants where they are similarly inductively charged. Power sources 112A and 112B are capable of continuous operation at temperatures up to roughly the melting point of lithium, around 180 degrees Centigrade. The equidistant spacing of the power sources 112A, 112B shown in FIGS. 1D and 1E, maintains the balance of PCMD 100 which is beneficial in situations where PCMD 100 may be spinning within a processing module. FIG. 1E shows the central axis 199 of PCMD 100 passing through the center of PCMD 100. Central axis 199 is perpendicular to a surface 198 of MD 100. The center of gravity of PCMD 100 lies along central axis 199. Central axis 199 is the axis of rotation when PCMD is spun in a processing module. Batteries 112A and 112B are equidistant from central axis 199 and are 180 degrees apart. Thus, where batteries 112A and 112B are of the same mass, their combined center of gravity is along central axis 199. Additionally, the other components are arranged in order to maintain as uniform a mass and thermal profile as possible. A passivation layer 116 and an optional shield layer are formed above all of the components of PCMD 100 in order to protect the components and substrate from various processing conditions. The layers that make up PCMD 100 will be described in further detail later with reference to FIGS. 3 and 4.

Coil 108 of FIG. 1 may be located within a cavity in the substrate. Coil 108 may be extremely thin so that it does not add to the overall height of the PCMD 100. For example, FIG. 5A shows a cross-section of a coil 508 during inductive charging. In this example, coil 508 includes several windings of increasing radius. However, coil 508 is only one winding in height so that the thickness of coil 508 is approximately the same as the thickness of the conductor used for the winding. Coil 508 may be located in the middle of the wafer as shown in FIG. 1A. FIG. 5A shows a similar coil 508 in a cavity 550 within the substrate 502. FIG. 5A shows the position of coil 508 with respect to an E-coil 510 located in electronics module 508. E-coil 510 maybe used to supply power to the PCMD 100 by inducing an electrical current in the windings of coil 508. E-coil 510 may also be used to transmit data to coil 508. Thus, the induced field is used to transmit both power and data to PCMD 100. E-coil 510 typically provides an RF field at a frequency of 13.56 MHz. One advantage of placing coil 508 at its axis passes through the center of the PCMD is that it may easily be aligned with an external unit such as E-coil 510 because the rotational orientation of PCMD 100 does not affect the position of the coil 508. Thus, E-coil 510 may serve as a transmitting unit that may transmit both power and data.

FIG. 5B shows coil 508 having a magnetic conductive layer 555. Magnetic conductive layer 555 may be made of a ferrite material. The induced field is concentrated in magnetic conductive layer 555 and so the magnetic field in the substrate 502 is minimized. Where the substrate 502 is made of a conductive material such as doped silicon this is especially advantageous. When the RF field extends into a conductive substrate the changing magnetic field in the substrate induces eddy currents. These eddy currents dissipate the RF field and result in a lower efficiency of power transfer between E-coil 510 and coil 508. In addition, eddy currents flowing through a conductive substrate may heat the substrate and could damage PCMD 100.

Clock crystal 132 is part of a crystal oscillator circuit. FIG. 6 shows an example of a high temperature crystal oscillator circuit 660 that may be used for this application. High temperature crystal oscillator circuit 660 is comprised of a conventional crystal oscillator circuit 661 and a biasing circuit 670. The conventional oscillator circuit 661 includes a crystal 632, amplifier 662 and capacitors 663 and 664. The amplifier 662 and capacitors 663 and 664 are within CPU 604, while the crystal 632 is external to the CPU. The biasing circuit 670 includes counter 671, ring oscillator 672 and bias control unit 673 within CPU 604. In addition, biasing circuit 670 includes a series of resistors 675 that are connectable to the crystal under the control of bias control unit 673. Resistors 675 are external to CPU 604.

Amplifier 662 provides positive feedback to maintain the oscillator signal. Amplifiers available in commercially produced ICs, such as amplifier 662, are specified as working over a certain range of temperature, for example 0–85 degrees centigrade. When the temperature is higher than the specified range, conventional oscillator circuit 661 may no longer function correctly. Threshold voltages of components in the amplifier may shift which eventually causes oscillation to cease or startup to fail. When amplifier 662 is working within its specified temperature range it produces a signal with a 50% duty cycle. With increasing temperature the duty cycle increases and as the duty cycle approaches 100% conventional oscillator circuit 661 ceases to function.

Biasing circuit 670 overcomes this problem by biasing the input of amplifier 662 in order to maintain a 50% duty cycle. Counter 671 uses the input from ring oscillator 672 to determine the duty cycle. Counter 671 counts the number of clock cycles of ring oscillator 672 during the "on" phase of the output of amplifier 662. It then counts the number of clock cycles of ring oscillator 672 during the "off" phase of the output of amplifier 662. The counts are sent to the bias control unit 673 where the duty cycle is. determined. If these counts are equal then the duty cycle is 50%. If the count for the "on" phase exceeds the count for the "off" phase, then the duty cycle is greater than 50%. The frequency of ring oscillator 672 is greater than the frequency of the output of conventional oscillator circuit 661. Typically, the conventional oscillator circuit has an output frequency of about 32 kHz while the ring oscillator has an output frequency of about 400 kHz–4 MHz. Ring oscillator 672 may suffer from a change in frequency at high temperature. However, because the output for two periods are compared, the absolute value of the output over a given period does not affect the determination of duty cycle.

If the duty cycle is determined to be greater than 50% the bias control unit 673 may modify the bias input 676 to reduce the duty cycle. This may be done in a number of ways. In the example shown in FIG. 6, a series of resistors 675 of different resistances are connected between a bias voltage and bias input 676. The bias voltage used may be Vcc on the CPU chip. In this way, the voltage and current at the input of amplifier 662 may be controlled to bring the duty cycle back to 50%. Using this technique, the effective range of high temperature crystal oscillator circuit 660 may be extended from the stated upper limit of the CPU chip 604 (85 degrees centigrade) to as high as 150 degrees centigrade. This allows PCMD 100 to use standard parts in conditions that would otherwise require custom parts. As alternatives to using resistors 675, other comparable means may be used to modify impedance such that a change in bias is achieved. These alternatives include an electronic potentiometer, transistor, voltage resistor network.

Transmitter 128 shown in FIG. 1A may be used to transmit data from the PCMD. Here, transmitter 128 is an LED. This is a more energy efficient way to transmit data than using RF via coil 108. For transmission from the PCMD energy efficiency is important, whereas for transmitting data to the PCMD energy is generally not as critical so that RF may be used. In the example shown in FIG. 1A the transmitter is located at the center of the upper surface of the PCMD. Placing LED 128 in the center allows it to be more easily aligned with any external receiver because the position of LED 128 with respect to the external receiver will not vary if PCMD 100 is rotated. This may be important where PCMD 100 is rotated during a survey as occurs in some environments.

In another embodiment shown in FIG. 7, four transmitters 728–731 are located around coil 708. This example also uses LEDs as transmitters 728–731. Using multiple LEDs allows a receiving unit 777 in an electronics module 778 receive a good signal even where receiving unit 777 is not aligned with the center of PCMD 700. Where one LED at the center of a PCMD is used (as in FIG. 1) but the receiving unit in the electronics module is offset from the center, a poor signal or no signal may be received because the LED directs light in a limited cone. The receiving unit 777 may be offset because the E-coil occupies a space covering the center of the PCMD. Thus, it is desirable to have one of LEDs 728–731 aligned with the offset position of the receiving unit 777. This requires more than one LED (four, in this example) so that one LED is below the receiving unit regardless of the rotational orientation of the PCMD 700. However, for energy efficiency it is desirable to transmit via only one LED. Therefore, a technique is provided for determining the optimum LED to transmit data.

The optimum LED is determined as part of a handshaking routine between the electronics module 708 and the PCMD 700. First, the electronics module 708 sends a signal to the PCMD 700 via the RF coil 708, telling PCMD 700 to begin transmission. The PCMD 700 begins transmitting using LED 728. If the electronics module 708 does not receive a signal after a predetermined time, another signal is sent to the PCMD 700 requesting a transmission. The PCMD 700 transmits using LED 729. If receiving unit 777 receives no signal, then LED 730 is used. If no signal is received from LED 730, then 731 is used. Because LED 731 is directly below receiving unit 777, the signal is received and LED 731 is identified as the optimum LED The PCMD then uses only the optimum LED 731 and may turn off the other LEDs 728–730 to conserve energy. More LEDs may be used depending on the configuration of the receiving unit or units. LEDs maybe arrayed in different locations and pointed in different directions depending on where the data is to be sent.

Utilizing the limited storage capacity of the power sources efficiently is desirable to maximize the amount of data and measurement time of the PCMD. The sensor groups that are activated are user selectable, the groups are only activated when necessary. Outputs from selected groups are multiplexed and only written into memory at selected intervals. The output is also compressed to minimize the amount of time and energy needed to store the data.

As defined herein, "processing conditions" refer to various processing parameters used in manufacturing an integrated circuit. Processing conditions include any parameter used to control semiconductor manufacture or any condition a manufacturer would desire to monitor such as, but not limited to, temperature, processing chamber pressure, gas flow rate within the chamber, gaseous chemical composition within the chamber, position within a chamber, ion current density, ion current energy, light energy density, and vibration and acceleration of a wafer or other substrate within a chamber or during movement to or from a chamber. Different processes will inevitably be developed over the years, and the processing conditions will, therefore, vary over time. Therefore, whatever the conditions may be, it is foreseen that the embodiments described will be able to measure such conditions.

Sensors 124 are used for detecting various processing conditions are mounted on or fabricated in substrate 102 according to a well-known semiconductor transducer design. For measuring temperature, a popular transducer is an RTD or thermistor, which includes a thin-film resistor material having a temperature coefficient. A magneto-resistive material may also be used to measure the temperature through the amount of magnetic flux exerted upon substrate 102. A resistance-to-voltage converter is often formed within the substrate between distal ends of the resistive-sensitive material (either thermistor or magneto-resistive material) so that the voltage may easily be correlated with a temperature scale. Another exemplary temperature sensor includes a thermocouple made of two dissimilar conductors lithographically formed in the layers of the substrate. When the junction between the conductors is heated, a small thermoelectric voltage is produced which increases approximately linearly with junction temperature. Another example of a temperature sensor includes a diode that produces a voltage that increases with temperature. By connecting the diode between a positive supply and a load resistor, current-to-voltage conversion can be obtained from the load resistor. Another sensor is a piezoelectric device such as a quartz tuning fork fabricated from quartz crystal cut on a crystal orientation which exhibits a temperature dependent frequency of oscillation. The sensor's oscillating frequency can be referenced against a master oscillator formed by a piezoelectric device such as a quartz tuning fork, which is fabricated from a crystal oriented to minimize frequency change with temperature. The frequency difference between the sensor and master oscillator would provide a direct digital temperature dependent signal. Piezoelectric sensors may also be used to sense mass change to measure deposition mass and rates or other process conditions.

Sensors 124 may also be used to measure pressure, force or strain at select regions across substrate 102, either as a discrete sensor or a sensor integrally formed in the layers of substrate 102. There are many types of pressure transducers capable of measuring the atmospheric pressure exerted upon the wafer. A suitable pressure transducer includes a diaphragm-type transducer, wherein a diaphragm or elastic element senses pressure and produces a corresponding strain or deflection which can then be read by a bridge circuit connected to the diaphragm or cavity behind the diaphragm. Another suitable pressure transducer may include a piezoresistive material placed within the semiconductor substrate of substrate 102. The piezoresistive material is formed by diffusing doping compounds into the substrate. The resulting piezoresistive material produces output current proportional to the amount of pressure or strain exerted thereupon.

Sensors 124 may also be used to measure flow rate across substrate 102. In addition, humidity and moisture sensors can also be formed upon substrate 102. A well-known method for measuring flow rate, a hot-wire anemometer, may be incorporated into substrate 102. Fluid velocity is based upon the frequency of vortex production as a streamlined fluidic flow strikes a non-streamlined obstacle positioned on or in substrate 102. Measurement of fluid flow generally involves the formation of special vortices on either side of the obstacle. Thus, an alternating pressure difference occurs between the two sides. Above a threshold (below which no vortex production occurs), the frequency is proportional to fluid velocity. Of many methods of detecting the alternating pressure difference, a hot thermistor is preferably placed in a small channel between the two sides of the obstacle. The alternating directions of flow through the capitalized channel periodically cool the self-heated thermistor thereby producing an AC signal and corresponding electric pulses at twice the vortex frequency. Therefore, an obstacle protruding from substrate 102 in front of a thermistor can provide solid-state flow rate measurement. Heat can be transferred between self-heated thermistors placed in close proximity to each other. Fluid flow transfers thermal energy between the adjacent thermistors causing a thermal imbalance proportional to mass flow. Two or more adjacent sensors can be arrayed to measure flow along a vector, or multiple flow vectors may also be sensed. The thermal imbalance can be detected to produce a DC signal related to mass flow. Flows in multiple directions can be compared to detect flow vectors.

Sensors 124 can also be used to measure the gaseous chemical concentration placed upon substrate 102. Chemical composition sensors utilize a membrane which is permeable to specific ions to be measured. Ideally, the membrane should be completely impermeable to all other ions. The conductivity of the membrane is directly proportional to the transport of select ions which have permeated the membrane. Given the variability of membrane conductivity, measurements can be taken which directly correlate to the amount of chemical ions present within the ambient surrounding substrate 102.

Sensors 124 may also be used to measure ion current density and ion current energy with a parallel plate structure, an array of collecting plates, and collecting plates with control grids supported above the collecting plates. The current flowing between parallel plates, or to the array of collecting plates will increase with ion current density. Ion current energy can be detected by applying a constant or varying DC potential on the grids above the plates. This will modulate current flow with ion current energy allowing the energy distribution to be detected. This is useful in monitoring and regulating a deposition or etching process.

A piezoelectric transducer/sensor may also be integrated into substrate 102 to measure the resonant frequency of a layer and thus the mass or thickness of the layer.

Additionally, sensors 124 can also be used to detect a change in position or displacement of an object spaced from substrate 102. Exemplary displacement transducers include electro-optical devices which can measure photon energy (or intensity) and convert photon energy to an electric field or voltage. Relatively well known electro-optical devices include light-emitting diodes, photodiodes, phototransistors, etc., which can be formed upon a semiconductor substrate or discrete devices embedded within the substrate or placed on the surface. Displacement sensors are used to provide accurate information about electrode spacing within an etch or deposition chamber, and can also provide spacing information between a wafer and corresponding masks and/or radiation source.

FIG. 1B illustrates some components of PCMD 100 within substrate 102. FIG. 1B is not a true cross section of PCMD 100, but only serves to illustrates how the components such as sensors 124, oscillator 132, microprocessor 104, power source 112, resistor 113, and capacitor 115 are located within recesses formed in PCMD 100. Further details of this are shown in FIG. 1C, where a component 140 is affixed to a cavity 142 within substrate 102 (and the other layers on substrate 102) with bonding material 144. Bond wires 148 electrically couple the component 140 with conductive traces 120 seen in FIG. 1A. Bond wires 148 and component 140 are covered with potting material 152.

FIG. 1D illustrates an embodiment of PCMD 100 with graycode coding 150 around the edge. This graycode coding is used to determine the position or rotation of the PCMD with regard to reference axes, and will be described in more detail later.

FIGS. 2A and 2B illustrate PCMD handling system ("HS") 200. Handling system 200 generally speaking includes a user interface and various electronic components, including a microprocessor and memory, for transferring data to and from a number of PCMDs and for configuring, recharging, and transporting the PCMDs.

Cassette 204 can accommodate several PCMDs and may be located at an opening of a processing chamber or a tool that has multiple process chambers such that a robot arm may automatically place or remove the PCMDs within one of the various slots 250 of cassette 204. Cassette 204 is a standard cassette that is compatible with a range of tools. Alternatively, a modified cassette could be used as long as it is compatible with the mechanical automation used within the facility where a PCMD is used. FIG. 2A illustrates the back or process side of HS 200. The PCMDs are inserted and removed from the process side. One PCMD 100 is shown just below electronics module 208 and above charging board 216. When a PCMD is placed in the cassette, its power source(s) are inductively charged by electronics module 208 and charging board 216. An additional charging board may also be present in a push/pull configuration to increase the inductive charging rate. Although the embodiments described thus far utilize inductive charging, other embodiments may utilize optical components for charging and data transmission, although with the use of these optical components alignment is much more critical to proper recharging and data transmission. In any embodiment, the PCMDs may include graycode coding around the periphery, and HS 200 may also have optical sensors that detect the alignment of the PCMD while in the cassette 204 with the graycode coding (FIG. 1D). Therefore, the wafer can be optimally aligned for data recharging and data transmission. Additionally, if a PCMD returns with a different alignment than it departed with, this may indicate that it rotated some amount in the processing chamber, and that this rotation should be taken into account when analyzing the processing condition data gathered from the chamber or other environment.

Substrates are typically stored and transported in a substrate carrier such as cassette 204. Processing tools are adapted to a particular standard substrate carrier. Typical tools have robots that move substrates from a substrate carrier through the tool and back to a substrate carrier. Substrate carriers within a facility are interchangeable so that the robot may be calibrated to a substrate carrier and continue to operate with similar substrate carriers without being recalibrated. A single substrate carrier standard is used so that a substrate carrier may be moved from one tool to another and the robot in each tool may transport substrates to and from the substrate carrier.

FIG. 2C shows a view of a processing tool 260 that includes a robot 261 that transfers substrates to a processing chamber 269. The robot has a mechanical arm 262 with a blade (or endeffector) 263 attached to the end of arm 262 that can pick up a substrate 264. Substrate 264 is held in a substrate carrier 265 so that the blade 263 may be extended under substrate 264 to pick up substrate 264. Blade 263 may rise to lift substrate 264 or substrate 264 may be lowered onto blade 263. The position of substrate 264 is important to allow blade 263 to pick up substrate 264. Typically a substrate carrier has multiple slots, each slot holding one substrate. A slot is open on one side to allow a substrate to be removed. A slot establishes the position of a substrate. In particular the height of a substrate above the bottom surface of the cassette is established to allow a substrate to be picked up. The bottom surface of the cassette may be placed on a platform and the position of a substrate above the platform is accurately established so that the robot may automatically pick it up.

FIG. 2D shows a side view of processing tool 260 showing blade 263 extending under substrate 264 while substrate 264 is in substrate carrier 265. The height of substrate 263 above the bottom surface 266 of substrate carrier 265 is established. Each slot establishes the position of a substrate so that blade 263 may be inserted between substrates without touching them. A processing tool robot is generally calibrated to a standard substrate carrier so that substrates may be picked up or dropped off to any slot. Standard substrate carriers are used throughout a particular facility so that various tools are calibrated to a standard substrate carrier. Thus, substrates are repeatedly presented to a robot at the same positions and no recalibration is needed from one substrate carrier to another. Presenting a PCMD to a robot at one of the calibrated positions allows the PCMD to be transferred as if it were a standard substrate. Incorporating an electronics module in a single unit with a substrate carrier that presents a PCMD in this way provides a convenient location to exchange data and to recharge the PCMD in an automated fashion.

In some embodiments a HS is adapted for use with a substrate carrier other than cassette 204 such as a front opening unified port (FOUP) thus forming a handling system (or dock) where a PCMD may be stored, transported, charged and in which data may be exchanged. FIG. 8A shows an example of such a handling system 880. A FOUP is an industry standard carrier for handling 300 mm wafers. The specifications of both the FOUP and of 300 mm wafers are set by industry standards established by SEMI. A FOUP is particularly suitable for use as part of a HS. It is designed to hold wafers and to be compatible with a wide range of semiconductor processing and metrology equipment. It protects the PCMD and provides a clean environment for it so that the PCMD does not pick up contamination that might be brought into a target environment. When handling system 880 is placed at a loading station for a particular piece of equipment, the PCMD may be robotically transferred from the handling system to a target environment such as a process chamber using the same robot that is used for 300 mm wafers without requiring reconfiguration. Thus, handling of a PCMD may be identical with handling of a 300 mm wafer. Likewise, handling of handling system 880 may be identical to handling of a FOUP. The PCMD measures and records the conditions in the target environment during a specified period, for example, during a particular process recipe. Then, the PCMD is automatically returned to the handling system 880. Transfer of handling system 880 from one piece of equipment to another may also be automated. Thus, the combination of a PCMD and handling system 880 allows a PCMD to be delivered to its destination with a little human intervention, little disturbance to the production environment and minimal contamination to the target environment.

Inside handling system 880 an electronics module 808 similar to electronics module 208 may be mounted. The electronics module 808 contains a battery, an E-coil, and a data-receiving unit. A PCMD 800 may be placed adjacent to the electronics module, in this example the PCMD 800 is below the electronics module 808. In this position, it may receive RF power and RF data signals from the electronics module. It may transmit data by LED to the electronics module 808.

Handling system 880 may also include optical readers to observe the PCMD 100 and determine its rotational orientation. In the prior art wafers are rotated in a flat finder or notch finder to align them in a desired rotational orientation. A flat finder usually rotates the wafer about its axis above a set of optical sensors that are directed at the edge of the wafer. These sensors detect the flat (or notch) of the wafer as it passes and thus determine the rotational orientation. Subsequently, wafers may be realigned. Thus, relative motion between the wafer and the sensors is required. By using a greycode on a surface of a PCMD and having stationary optical readers, the rotational position of the wafer may be determined without any relative motion between the wafer and the optical reader.

FIG. 8B shows a section of an edge of a PCMD 100 having greycode 850. Greycode provides a pattern that uniquely identifies locations at the edge of the wafer. Greycode is generally a code whereby successive words change by just one bit. On the wafer surface this is represented by changes between light and dark areas created by patterning a deposited layer. A word may be read along a radius such as A–A' or B–B'. The word read at A–A' would be 1,1,1,0, and at B–B' would be 1,0,1,1, where light represents 1 and dark represents 0. This example uses a word of four bits. Using a word of 8 or 9 bits allows better resolution because a larger number of uniquely identified locations are possible. For example, with 8 bits, 256 different uniquely identified locations are possible. A reader, such as a linear array is used to determine the unique word at the location of the reader and also the position of the edge of the wafer. With two such readers, the rotational orientation of the wafer and the position of the center of the wafer may be found. The greycode may be located outside the area of the PCMD where the sensors are located so that sensors do not impinge on the greycode area and the greycode does not affect the sensors. Alternatively, where sensors impinge on the greycode area, the readers may be located so that at least one reader will be able to read the greycode. For example, where sensors are spaced 60 degrees apart near the edge of a PCMD, the readers may be spaced 90 degrees apart so that if one reader is aligned with a sensor then the other reader will have a clear reading. Both readers should still read the position of the edge of the PCMD so that the position of the center of the PCMD may be determined.

While rotation of a PCMD is not required to determine rotational orientation where a greycode is used, movement of a PCMD may be desirable for other reasons. Inductive coupling between PCMD 800 and electronics module 808 improves as the distance between them decreases. Improved alignment between the position of the center of PCMD 800 and electronics module 808 may also improve coupling. If the coupling is improved, energy transfer is more rapid and the time to recharge PCM 800 may be reduced accordingly. Communication may also be improved when PCMD 800 is correctly placed. Thus, moving PCMD 800 to the optimum position relative to electronics module 808 may be of value. Rotation of PCMD 800 may be desirable so that a particular rotational orientation of PCMD 800 may be selected. Typically, maintaining the same orientation from one survey to another will be desirable. In this way, data from one survey may be accurately compared with data from another survey as individual sensors collect data at the same locations each time. It may be necessary to rotate PCMD 800 for alignment with process chamber elements such as positioning of specific PCMD sensors over heating zones to correlate PCMD temperature profiles with heater zones. Sometimes, it is desirable to change the rotational orientation of a PCMD between surveys. A PCMD may have some inherent non-uniformity due to variation between individual sensors. Performing multiple surveys with different PCMD orientations allows the effects of such nonuniformity to be reduced or eliminated. For example, a PCMD may perform surveys at a first orientation, then at 90 degrees, 180 degrees and 270 degrees offset from the first orientation. The data from these surveys may then be averaged to provide a more accurate result.

FIG. 8C shows an alignment module 881 that can move a PCMD within a handling system such as handling system 880. Alignment module 881 includes a base structure 884 that forms a rigid platform for mounting other components. Base structure 884 is designed to fit in a slot within a handling system. For example, where handling system 880 is sized for 300 mm silicon wafers, base structure 884 may be a disk with a diameter of approximately 300 mm. However, base structure may be thicker than a silicon wafer because it does not need to be moved in or out of a slot. Base structure 884 may be made of a strong, rigid material such as a metal or plastic.

A housing 887 is mounted to the upper surface of base structure 884. Extending from the upper surface of housing 887 are a rotation stage 883 and an arm 888. Housing 887 may provide some support for rotation stage 883 and arm 888 and also provides some containment for any particles produced by moving parts enclosed within housing 887.

Arm 888 is a movable part that can be retracted into housing 887 or extended so that it protrudes from housing 887. Arm 888 may be moved by an electric motor in response to a command signal from an electronics module. At the end of arm 888 is a belt 882. Belt 882 passes around a wheel or bearing so that it may rotate around the end of arm 888. Alternatively, a wheel alone may be used instead of belt 882. In another example, instead of a pivoting arm such as arm 888, a post may be used. Such a post moves vertically with a wheel or belt extending from its upper surface. Alternatively, PCMD 800 may be raised and supported by wheels around its perimeter. The wheels pushing up on the wafer perimeter can raise PCMD 800 so it is floating above the FOUP or cassette ledge. By rotating the wheels, PCMD 800 can be centered by driving it into the V-shaped slot and then retracting it back a specified distance. PCMD 800 can then be rotated to the desired rotational angle.

Rotation stage 883 is a disk that protrudes above the tipper surface of housing 887. Rotation stage 883 may be rotated and may also be extended in the vertical direction. Rotation is possible in both the raised and lowered position but is typically performed in the raised position.

A robot blade detector 886 is mounted to base structure 884. Robot blade detector 886 may be an optical detector that can detect the presence of an object in its field of view. Robot blade detector 886 is located so that its field of view is placed where a robot blade from a host system may extend.

FIGS. 8D and 8E show alignment module 881 located within handling system 880. Base structure 884 extends into a slot in handling system 880 to support alignment module 881. Base structure 884 may be fixed in this position to provide a stable platform. Electronics module 808 is located above alignment module 881. PCMD 800 is between alignment module 881 and electronics module 808. FIG. 8D shows PCMD 800 in its normal position. The edges of PCMD 800 are resting on shelves provided within handling system 880. FIG. 8E shows PCMD 800 in a raised position. In this position it is closer to electronics module 808 so that coupling of RF power between electronics module 808 and PCMD 800 is improved. PCMD 800 is raised to this position by rotation stage 883.

FIG. 8F–8H show alignment module 881 aligning PCMD 800. Each of FIGS. 8F–8H shows two perspectives. The left view is from above and to one side. The right view is a corresponding cross-sectional view. FIG. 8F shows PCMD 800 positioned above alignment module 881. PCMD 800 is held at its edges as in FIG. 8D. Arm 888 is retracted and is therefore not visible in this view. Rotation stage 883 is clear of PCMD 800. PCMD 800 may not be centered correctly at this point. This means that the center of PCMD 800 may not be directly under the center of an electronics module. Also, PCMD 800 may not have the desired rotational orientation. Either linear or rotational misalignment of PCMD 800 may be detected by greycode readers as described above. In order to obtain an accurate map of conditions measured by PCMD 800 the positions of the sensors on PCMD 800 must be known. Thus, any map generated assumes a certain rotational orientation. It is generally desirable that PCMD 800 be returned to this orientation if any change occurs.

FIG. 8G shows arm 888 in the raised position. With arm 888 in this position, belt 882 contacts the underside of PCMD 800. Belt 882 engages the underside of PCMD 800 and drags PCMD 800 in the direction indicated. In a handling system this direction corresponds to dragging the PCMD deeper into its slot. Therefore, the travel of PCMD 800 is limited by the physical limits of the slot. Belt 882 may be a belt that is turned by motor and that has a surface that provides sufficient traction to drag PCMD 800.

FIG. 8H shows alignment module 881 with arm 888 in the retracted position (out of sight) and rotation stage 883 in a raised position. PCMD 800 is supported by rotation stage 883. PCMD 800 is clear of other parts of the handling system at this point. PCMD 800 may be rotated by rotation stage 883 until it reaches a desired orientation. PCMD 800 may remain in a raised position for recharging from electronics module 808. When recharging is complete, rotation stage 883 may be lowered and PCMD 800 may be returned to its normal position where it may be picked up by a robot blade that extends under it and lifts it from its slot.

Robot blade detector 886 ensures that alignment module 881 does not attempt to engage PCMD 800 while the robot blade is extended under PCMD 800. If alignment module 881 tried to engage at such a time, damage could occur to PCMD 800, alignment module 881 or the robot blade. To prevent this alignment module 881 may have an interlocking mechanism to prevent it from operating when robot blade detector 886 detects the presence of a robot blade.

After data is collected by a PCMD and transferred to a handling system, the data may still need to be transferred to a point where it can be accessed by an end-user. This may be done in a variety of ways as shown in FIG. 9. For example, the end-user 985 may access the data collected by PCMD 900 by using a laptop computer connected to the handling system by a USB cable, IRDA connection Wi-Fi or Bluetooth wireless connection. The handling system 980 may connect to a network by an Ethernet connection allowing the end-user to receive data on a PC at another location. A PDA may be used instead of a PC for receiving and viewing data. Alternatively, the data may be recorded on a flash memory card and physically moved to a laptop, pda or other device. A software application 987 processes the data sent by the handling system 980 to provide data to end-user 985 in a format that is appropriate. For example, digital data may be converted into temperature readings. Software application 987 may run on a variety of platforms including laptop PC, desktop PC or PDA.

In one embodiment, the transfer of data from handling system 980 is achieved by using an active RFID transmitter in handling system 980. This takes advantage of the presence of an RFID reader close to the FOUP to transmit data to a network where it may be accessed by an end-user. Semiconductor Fabrication facilities (Fabs) that use FOUPs generally track the individual FOUPs and their contents by means of RFID tags. Tags are generally passive devices capable of providing an identification number when they are interrogated by a reader. A reader is generally provided at the load port where a FOUP connects to a processing system so that the identity of the FOUP at the load port at any particular time is known. A network of such readers throughout the Fab are connected to a software system that can monitor the position of different FOUPS and coordinate the movement of FOUPs to optimize efficiency. Certain industry standards regarding such a network are detailed in "General model for communications and control of manufacturing equipment," (GEM), SEMI E30 and SEMI E87-0703. The presence of such a reader connected to a network provides a convenient way to transfer data from a handling system to an end-user.

An active RFID transmitter may be used to send recorded data and other information from a handling system to a reader. The network may be configured to process data in packets corresponding in size to the identification number for a FOUP, typically 80 bytes. In this case, the information from handling system may need to be sent in a series of 80 byte chunks. Using an RFID system for this purpose has the advantage that the receiving hardware already exists at the desired location and is connected to a network, the transmission is over a very short range and thus requires very little power and does not generally suffer from interference from neighboring systems. Two types of RFID are commonly used, a low frequency system at a frequency of 125 kHz that has a range of less than 12 inches and a high frequency system operating at 13.56 MHz that has a range of about 90 feet. Either may be used for sending data according to this invention. Active RFID transmitters may transmit in 3-dimensions so that the alignment of the transmitter and reader are not critical. One example of such a transmitter is an ECM electronics 3DC1515. While the above example refers to FOUP technology used with 300 mm wafers, this aspect of the invention may also be used with other industry standard substrates and substrate carriers such as 200 mm wafers and SMIF (standard mechanical interface). Similar industry standards exist for other substrates and carrier.

FIG. 2B shows the front or user side of HS 200. A memory card 228 is shown inserted into electronics module 208 and may be considered part of HS 200. HS 200 accommodates any number of memory card formats such as but not limited to the smartcard®, Sony memory stick®, the Secure Digital ("SD") card®, Compact Flash ("CF"), or Multi-Media Card® ("MMC"). A PCMD is sent out "on a survey" to record the various conditions in different types of environments. For each environment and for the entire survey, it may be desirable to alter various parameters of the PCMD such as the sampling rate, sampling duration, and the sensors used. Display 232 quickly conveys information to a user regarding the setup of the PCMD such as the number and arrangement of sensors to be used in a survey, the length and times of the various cycles of a survey, and the sampling rate of the sensors and sensor electronics etc. A survey profile and the data retrieved on the survey may also be stored on the memory card 228 or within flash memory of electronics module 208.

All the parameters of PCMD 100 and HS 200 may also be accessed and configured by a personal computer or other smart device that communicates via a universal serial bus (USB) of port 224 or via an infrared port 220. They may also be accessed by a remote control communicating to infrared port 220. HS 200 and the PCMDs may also be configured and the data gathered may be manipulated with the function switches 240 that are software driven and control/access the most often used parameters of a PCMD. Indicator lamps 232 also serve to inform the user of the condition of HS 200 and the PCMDs within HS 200. Viewport 244 allows a user to view one or more of the PCMDs.

FIGS. 3A and 3B are cross sections of embodiments of PCMD 100 (without the components) that will be referenced by the flowcharts of FIGS. 4A and 4B, respectively. The cross sections and flow charts describing how the PCMDs are made should be viewed in tandem.

FIG. 4A describes the process of making an embodiment with a single conductive layer used for the circuit traces. In step 404 of FIG. 4A, insulating layer 304 is formed upon substrate 102. Insulating layer 304 preferably comprises an oxide, but may be any well known insulating material, and may be deposited or grown upon the surface of substrate 102. In step 408, insulating layer 308 is formed upon insulating layer 304. Insulating layer 304 and 308 preferably, but not necessarily, comprise different materials. In the preferred embodiment, insulating layer 308 comprises a nitride. In step 412, a conductive layer 312 is formed upon insulating layer 308. Next, in step 416, electrical traces are patterned and etched in conductive layer 312 according to well known patterning and etching methods. In step 420, passivation layer 316 is formed upon the conductive traces of step 416. In step 424, cavities 142 for components 140 are formed within the substrate through one or more of the layers. The cavities 142 may be mechanically formed or may be etched. In step 428, components 140 (not shown) are inserted within cavities 142 and electrically coupled to the traces in conductive layer 312, seen in FIG. 1C. Next, in step 432, a passivation layer (not shown) is formed over components 140 and the other layers. The passivation layer may comprise any well-known materials, but preferably comprises polyimide or oxynitride. Optionally, step 436 may be performed, in which an electrical and chemical protective shield layer is formed over the passivation layer. This is especially useful in protecting the PCMD from very harsh processing environments such as in plasma etch chambers, as the shield layer is nearly impermeable to the gases and other elements common to such environments. The shield layer should also be resistant to the etching process induced by high energy ion bombardment in plasma chambers. One example of a shield layer is actually a composite of different layers, including a polymer layer such as Mylar®, a PE layer, a metallic foil, and a sealant layer such as surlyn®. The total thickness of the shield layer may range from 25 to greater than 99 microns.

FIG. 4B describes the process of making an embodiment with two conductive layers coupled by inter-level vias. Steps 404 and 408 are the same as those in FIG. 4A. In step 412, the first conductive layer 312A is formed on insulating layer 304. In step 413, a dielectric layer 310 is formed upon conductive layer 312A. After that, openings for vias 312C are formed in dielectric layer 310 in step 414. Next, in step 415, conductive layer 312B and vias 312C are formed on/in the dielectric layer 310. In step 416 electrical traces are patterned and etched in the exposed portion of conductive layers 312A and 312B. Steps 420–436 are the same as in FIG. 4A.

FIGS. 10A and 10B show examples of lids 1010–1013 protecting components 1020–1022 of the PCMD from the environment. In FIG. 10A a single lid is used for three components. The number of components covered by a single lid depends on the sizes and locations of the components but may be anything from one component to all the components in the PCMD. FIG. 10A shows three components 1020–1022 and the attached wire bonds 1048 covered by a single lid 1010. In FIG. 10B separate lids 1011–1013 are used for each component 1020–1022. Various materials may be used to form lids such as lids 1010–1013. For example, a ceramic lid similar to that used for packaging integrated circuits may be adapted to cover a component or group of components in a PCMD. For particularly harsh chemical environments lids may be made from materials such as sapphire that resist chemical attack. Where protection from electromagnetic fields is required, lids may be made of conductive material such as metal or doped silicon. For some applications, plastic lids may be used. Lids 1010–1013 are bonded to the substrate 1002 in a conventional manner.

In the example of FIG. 10C, a single lid 1030 is used to cover the upper surface of the substrate 1002. Lid 1030 may be made of the same material as substrate 1002. For example, where the substrate is made of silicon, the lid may also be made of silicon. Thus, PCMD 1000 resembles a silicon wafer from the outside. Its appearance and characteristics are similar to those of a silicon wafer so that the measured values are as close as possible to the values that would be found in a silicon wafer. The lid 1030 may be bonded to substrate 1002 to form a sealed unit. Cavities within such a unit may be filled with a suitable material to exclude gas that might expand at high temperature and cause the unit to fail.

In the example shown in FIG. 10D, a three layer structure is used. Traces (not shown) may be formed and components 1020–1022 may attached to substrate 1002 and bonded to the traces. Then, a second layer 1050 is put in place. This layer has cutouts formed for the components 1020–1022. This layer may be silicon so that it has similar characteristics to the substrate 1002. Next, a lid 1030 is attached to the upper surface of layer 1050. This method allows cavities to be uniform in depth because the depth of each cavity is equal to the thickness of layer 1050. Also, the upper and lower surfaces of layer 1050 may be highly planar providing good attachment to substrate 1002 and lid 1030.

In an alternative embodiment, instead of raising PCMD 800 to move it closer to the electronics module, the electronics module or a portion of the electronics module is lowered to bring it closer to PCMD 800. FIG. 8I shows a portion of an electronics module that contains E-coil 810 being lowered towards PCMD 800. As the distance between E-coil 810 and PCMD 800 decreases, the efficiency of power transfer from E-coil 810 to PCMD 800 improves. Typically, when E-coil is close to PCMD 800, the time to recharge PCMD 800 is about ten minutes.

When robot blade detector 886 detects a robot blade approaching PCMD 800, moving parts that might interfere with the robot blade must be placed in positions where they do not interfere. Where E-coil 810 is lowered to improve coupling with PCMD 800, it must be retracted before the robot blade attempts to lift PCMD 800. Typically, this means that it must be retracted within 0.1–0.3 seconds from the time that a robot blade is detected by robot blade detector 886.

In one embodiment, the position of the FOUP door may determine the position of E-coil 810. When the FOUP door is open, the robot may attempt to pick up a PCMD, so E-coil 810 is kept in the raised position. When the FOUP door is closed, the robot will not attempt to pick up the PCMD, so E-coil 810 is placed in the lowered position. The movement of E-coil 810 may be triggered or powered by the movement of the FOUP door. Alternatively, the movement may be powered by a motor or a spring. Linking E-coil motion to the FOUP door motion may make robot blade detector 886 unnecessary.

A compression algorithm is utilized for the multiple channels of data. The algorithm may use both spatial and temporal compression. It is suitable for signals with small temporal motion and uses an adaptive compression that depends upon signal shape and environment. It comprises three steps: 1) analyzes spatial temperature distribution; 2) analyzes temporal distribution; 3) analyzes temperature profile and characteristics; and 4) compresses or omits certain data based upon differences across the wafer detected in the above steps.

The embodiments described above have applications in monitoring processing conditions in locations other than processing chambers. Conditions experienced by wafers during transport and storage may also affect the characteristics of the devices produced and therefore it may be desirable to measure and record such conditions. For example, a PCMD may remain in a FOUP to record conditions in the FOUP. This data may be recorded in the PCMD or may be transmitted by RFID without being stored.

While particular embodiments of the present invention and their advantages have been shown and described, it should be understood that various changes, substitutions, and alterations can be made therein without departing from the spirit and scope of the invention as defined by the appended claims. For example, the location and type of the sensors may be different than in the examples described.

The invention claimed is:

1. A sensing apparatus for sensing conditions in target environments in a processing facility where a standard substrate is transported in a standard substrate carrier that establishes a position of the standard substrate relative to a surface of the standard substrate carrier and where the robot of at least one processing tool is calibrated to the position of the standard substrate relative to the surface of the standard substrate carrier, comprising:
   a first portion that includes:
      a substrate;
      a plurality of sensors attached to the substrate;
   a second portion that includes:
      a substrate carrier that establishes the position of the first portion relative to a surface of the substrate carrier to be the same as the position of the standard substrate relative to the surface of the standard substrate carrier;
      an electronics module that communicates with the first portion, the electronics module attached to the substrate carrier; and wherein the first portion may be moved independently of the second portion.

2. The sensing apparatus of claim 1 wherein the substrate carrier is a standard substrate carrier.

3. The sensing apparatus of claim 1 wherein the position of the standard substrate relative to the surface of the standard substrate carrier is the vertical height of the standard substrate above the bottom surface of the standard substrate carrier.

4. The sensing apparatus of claim 1 further comprising:
a receiving unit attached to the substrate that receives power from the electronics module; and
a transmitting unit in the electronic module that transmits power to the receiving unit.

5. The sensing apparatus of claim 4 wherein the receiving unit is located at the center of the substrate so that when the substrate is placed in the substrate carrier the receiving unit is aligned with the transmitting unit regardless of the rotational orientation of the substrate.

6. The sensing apparatus of claim 4 wherein the receiving unit receives data from the electronics module and the transmitting unit transmits data to the receiving unit.

7. The sensing apparatus of claim 4 wherein the transmitting unit comprises an E-coil and the receiving unit comprises a conductive coil and a magnetic conductive layer.

8. The sensing apparatus of claim 1 wherein the second portion further comprises an RFID transceiver electrically connected to the electronics module so that data may be sent from the electronics module to the RFID transceiver and data may be sent from the RFID transceiver to an external receiver.

9. The sensing apparatus of claim 1 further comprising:
a pattern on at least one surface of the substrate; and
an optical reading apparatus apparatus to the substrate carrier that reads the pattern on the substrate to determine the orientation of the substrate.

10. The sensing apparatus of claim 1 wherein the second portion further comprises an alignment module that aligns the first portion relative to the substrate carrier.

11. A sensing apparatus for sensing process conditions in a processing tool that has a robot that transfers a standard substrate between a standard substrate carrier and a process chamber, comprising:
a process condition measuring device, comprising:
a substrate;
a plurality of sensors attached to the substrate;
a handling system, comprising:
a substrate carrier that holds the process condition measuring device, the robot transferring the process condition measuring device between the substrate carrier and the process chamber; and
an electronics module attached to the substrate carrier that communicates with the process condition measuring device while the substrate carrier holds the process condition measuring device.

12. The sensing apparatus of claim 11 wherein the substrate carrier is a standard substrate carrier.

13. The sensing apparatus of claim 1 wherein the substrate carrier is a front opening unified pod (FOUP).

14. The sensing apparatus of claim 11 wherein the substrate carrier is a wafer cassette.

15. The sensing apparatus of claim 11 wherein the process condition measuring device further includes at least one battery and other components attached to the substrate and the location of the at least one battery and the other components that are attached to the substrate are configured such that the center of gravity of the substrate with the at least one battery and the other components is the same as the center of gravity of the substrate alone.

16. The sensing apparatus of claim 11 wherein the process condition measuring device further includes conductive traces connecting sensors to a CPU, at least one battery, a clock crystal and an RF inductive coil.

17. A two part apparatus for measuring process conditions within a process chamber, comprising:
a first part that includes a plurality of sensors for measuring one or more process conditions, a receiving unit that receives power and an energy storage unit attached to a substrate;
a second part that includes a housing for the first part, a power supply unit attached to the housing and a communication unit attached to the housing, the power supply unit providing power to the receiving unit of the first part and the communication unit providing communication between the first part and the second part; and
wherein the first part is housed in the second part in a first mode and is moved from the second part to the process chamber, without physical connection to the second part, in a second mode.

18. The two part apparatus of claim 17 wherein the substrate is a disk with the diameter of a silicon wafer and the housing is a wafer holder.

19. The two part apparatus of claim 18 wherein the power supply unit has an induction coil that inductively transmits power to the first part.

20. The two part apparatus of claim 19 wherein the communication unit uses the induction coil to provide communication between the first part and the second part.

21. The two part apparatus of claim 18 wherein the communication unit uses light to communicate with the first part.

22. The two part apparatus of claim 17 wherein the housing is a Standard Mechanical Interface (SMIF) box or a Front Opening Unified Pod (FOUP).

23. An apparatus for measuring conditions in a target environment, comprising:
a process condition measuring device that includes sensors to measure one or more process conditions in the target environment, the process condition measuring device further including a power supply and a first induction coil;
a handling system including a second induction coil, the handling system having a location to hold the process condition measuring device near the second induction coil, the first and second induction coils being inductively coupled when the process condition measuring device is at the location, the inductive coupling transferring both electrical power and data; and
the process condition measuring device being independently movable from the handling system to measure process conditions.

24. The apparatus of claim 23 wherein power is transferred from the handling system to the process condition measuring device through the inductive coupling and data is transferred from the process condition measuring device to the handling system through the inductive coupling.

25. The apparatus of claim 24 wherein data is also transferred from the handling system to the process condition measuring device through the inductive coupling.

* * * * *